United States Patent
Jeong et al.

(10) Patent No.: US 11,031,307 B2
(45) Date of Patent: Jun. 8, 2021

(54) SEMICONDUCTOR PACKAGE, BUFFER WAFER FOR SEMICONDUCTOR PACKAGE, AND METHOD OF MANUFACTURING SEMICONDUCTOR PACKAGE

(71) Applicant: SAMSUNG ELECTRONICS CO., LTD., Suwon-si (KR)

(72) Inventors: Chan Hee Jeong, Asan-si (KR); Hyun Ki Seo, Suwon-si (KR); Joo Hyung Lee, Cheonan-si (KR); Jae Gil Lim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 16/685,387

(22) Filed: Nov. 15, 2019

(65) Prior Publication Data

US 2020/0294869 A1    Sep. 17, 2020

(30) Foreign Application Priority Data

Mar. 14, 2019    (KR) .......................... 10-2019-0029036

(51) Int. Cl.
*H01L 21/66* (2006.01)
*H01L 23/31* (2006.01)
*H01L 21/56* (2006.01)
*H01L 25/065* (2006.01)

(52) U.S. Cl.
CPC .......... *H01L 22/32* (2013.01); *H01L 21/561* (2013.01); *H01L 21/568* (2013.01); *H01L 23/3128* (2013.01); *H01L 25/0657* (2013.01)

(58) Field of Classification Search
CPC ... H01L 22/32; H01L 23/3128; H01L 21/568; H01L 21/561; H01L 25/0657
See application file for complete search history.

(56) References Cited

U.S. PATENT DOCUMENTS

| | | | |
|---|---|---|---|
| 4,486,705 A * | 12/1984 | Stopper | G01R 31/2884 257/E21.526 |
| 7,888,776 B2 | 2/2011 | Ogawa et al. | |
| 8,890,560 B2 | 11/2014 | Kaltalioglu | |
| 9,159,646 B2 | 10/2015 | Xie et al. | |
| 9,257,352 B2 | 2/2016 | Daubenspeck et al. | |
| 9,557,376 B2 | 1/2017 | Dennison et al. | |
| 9,568,543 B2 | 2/2017 | Wang et al. | |
| 2013/0009663 A1 * | 1/2013 | Gauch | H01L 22/34 324/762.01 |
| 2017/0323835 A1 | 11/2017 | Ogawa et al. | |

* cited by examiner

*Primary Examiner* — Stephen W Smoot
*Assistant Examiner* — Vicki B. Booker
(74) *Attorney, Agent, or Firm* — Sughrue Mion, PLLC

(57) ABSTRACT

A semiconductor package includes a buffer wafer including: a first surface; and a second surface opposite to the first surface, a stacked structure including a plurality of chips being stacked on the first surface of the buffer wafer; a first detection line formed around a periphery of the stacked structure on the first surface of the buffer wafer; and a mold layer covering the stacked structure, the first detection line and the first surface of the buffer wafer.

20 Claims, 22 Drawing Sheets

SEMICONDUCTOR PACKAGE, BUFFER WAFER FOR SEMICONDUCTOR PACKAGE, AND METHOD OF MANUFACTURING SEMICONDUCTOR PACKAGE

This application claims priority under 35 U.S.C. § 119 to Korean Patent Application No. 10-2019-0029036 filed on Mar. 14, 2019 in the Korean Intellectual Property Office, the disclosure of which is incorporated herein by reference in its entirety.

BACKGROUND

1. Technical Field

Apparatuses and methods consistent with example embodiment relate to a semiconductor package, a buffer wafer for a semiconductor package, and a method of manufacturing the semiconductor package.

2. Description of the Related Art

During a semiconductor package assembling process, fine cracks may be formed in a wafer. These fine cracks may grow over time and may cause quality and reliability problems of the semiconductor chip and the semiconductor package.

In the related art, circuits such as a chipping detect circuit (CDC) may be incorporated in each chip at a wafer stage to detect cracks. During the detection step, if the signal does not return within a predetermined time, it is determined that cracks are present in the chip.

In the described related art, because the cracks are detected in a state in which a chip on wafer (CoW) process after performing other manufacturing processes on the wafer, wafers with cracks are not detected earlier thereby adding manufacturing cost and reducing manufacturing efficiency.

Therefore, there is a need for a technique capable of easily detecting the crack present in the wafers before chips are joined on the wafers.

SUMMARY

One or more example embodiments provide a semiconductor package capable of quickly detecting the presence or absence of cracks in advance at the wafer level.

One or more example embodiments also provide a buffer wafer for the semiconductor package capable of quickly detecting the presence or absence of cracks in advance at the wafer level.

One or more example embodiments also provide a method of manufacturing a semiconductor package capable of quickly detecting the presence or absence of the cracks in advance at wafer level.

According to an aspect of an example embodiment, there is provided a semiconductor package, comprising a buffer wafer including upper and lower surfaces, a stacked structure in which a plurality of chips is stacked on the upper surface of the buffer wafer, a first crack inspection line which is formed at an outline of the stacked structure on the upper surface of the buffer wafer and extends to an end of the buffer wafer, and a mold which covers the stacked structure, the first crack inspection line and the upper surface of the buffer wafer.

According to an aspect of another example embodiment, there is provided a semiconductor package, including a buffer wafer comprising: a first surface; and a second surface opposite to the first surface; a stacked structure comprising a plurality of chips being stacked on the first surface of the buffer wafer; a first detection line formed around a periphery of the stacked structure on the first surface of the buffer wafer; and a mold layer covering the stacked structure, the first detection line and the first surface of the buffer wafer.

According to an aspect of another example embodiment, there is provided a semiconductor package including a buffer wafer comprising a plurality of package regions being defined by scribe lines, the plurality of package regions including: a first package region; and a second package region; a first stacked structure formed on the first package region; a second stacked structure formed on the second package region; a first detection line formed as a single line extending along a periphery of the first stacked structure and the second stacked structure, the first detection line intersecting the scribe lines; and a first pad and a second pad, the first pad and the second pad being disposed at opposite ends of the first detection line, the first pad and the second pad being exposed to an exterior of the buffer wafer.

According to an aspect of another example embodiment, there is provided a buffer wafer for a semiconductor package, including a first surface comprising a plurality of package regions defined by a plurality of scribe lines, a plurality of stacked structures being stacked in the plurality of package regions, respectively; a second surface formed opposite to the first surface and on which a plurality of bumps respectively connected to the plurality of stacked structures are formed and a first detection line formed on the first surface and surrounding four sides of each of the plurality of stacked structures, the first detection line comprising a single line.

According to an aspect of another example embodiment, there is provided a method of manufacturing a semiconductor package, including bonding a buffer wafer and a carrier wafer to each other through a glue layer; forming a stacked structure on a first surface of the buffer wafer; forming a mold layer covering the stacked structure; separating the carrier wafer and the glue layer from the buffer wafer; and detecting a crack in the buffer wafer through a first detection line provided on the first surface of the buffer wafer, when forming the stacked structure on the buffer wafer.

According to an aspect of another example embodiment, there is provided a semiconductor package including a buffer wafer comprising a plurality of package regions provided on a first surface of the buffer wafer, the plurality of package regions being defined by scribe lines and including: a first package region; and a second package region, the first package region and the second package region arranged in a first direction adjacent to each other; a single crack detection line extending along a periphery of the first package region and the second package region; and a mold layer covering the plurality of package regions and the single crack detection line. The single crack detection line surrounds at least three sides of each of the first package region and the second package region.

The objectives of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and/or other aspects and features of the disclosure will become more apparent by describing in detail example embodiments thereof with reference to the attached drawings, in which.

DETAILED DESCRIPTION

Hereinafter, a wafer supporting system 1000 of a semiconductor package according to example embodiments will be described with reference to FIGS. 1 and 2.

Figure 1:
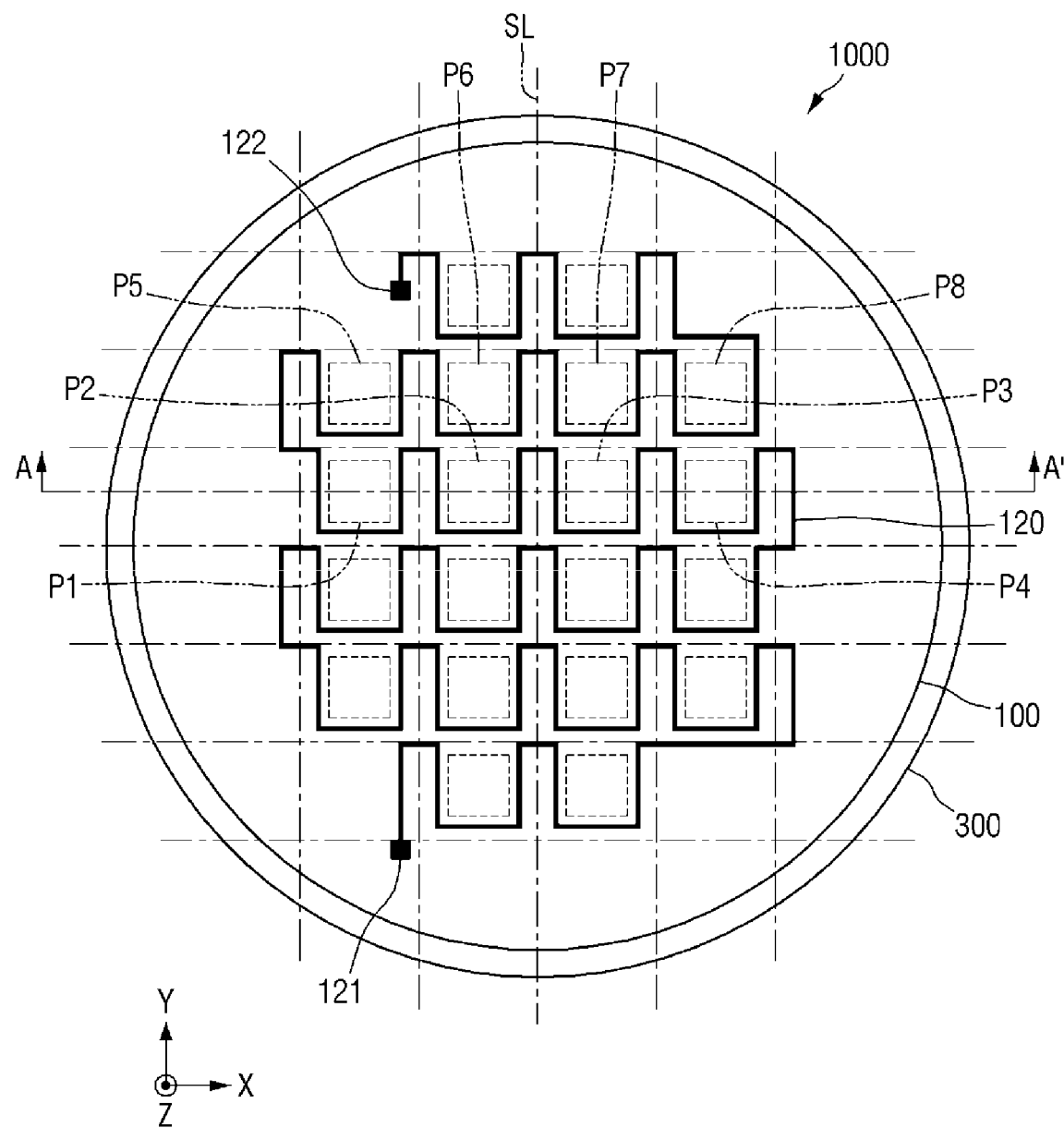
FIG. 1 is a plan view illustrating a wafer supporting system of a semiconductor package according to an example embodiment.
Figure 2:
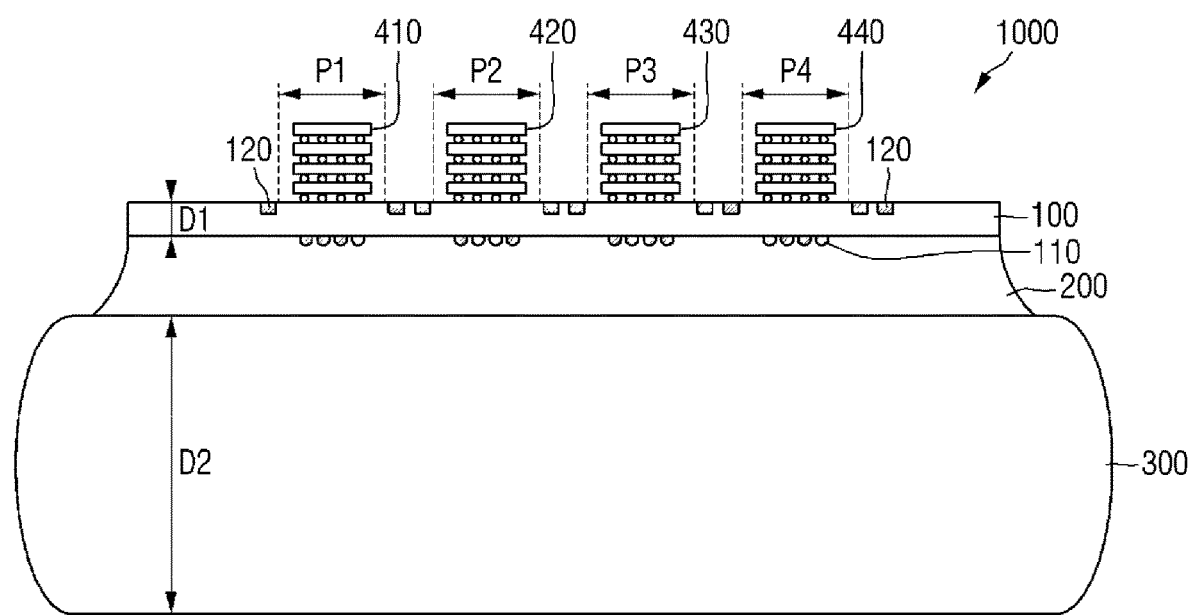
FIG. 2 is a cross-sectional view taken along line A-A' of FIG. 1.

FIG. 1 is a plan view illustrating a wafer supporting system 1000 of a semiconductor package according to an example embodiment, and FIG. 2 is a cross-sectional view taken along line A-A' of FIG. 1 according to an example embodiment.

Referring to FIGS. 1 and 2, a wafer supporting system (WSS) 1000 of the semiconductor package according to an example embodiment includes a buffer wafer 100, a glue layer 200, a carrier wafer 300, a bump 110, a first stacked structure 410, a second stacked structure 420, a third stacked structure 430, a fourth stacked structure 440 (hereinafter "first to fourth stacked structures 410-440" or "stacked structures"), a first crack detection line 120 embedded in the buffer wafer 100, a first pad 121 and a second pad 122.

The buffer wafer 100 may be a circular wafer and may include silicon (Si). However, the example embodiment is not limited thereto. During manufacturing of the semiconductor package, by stacking the stacked structures with chips on an upper surface of the buffer wafer 100, a semiconductor package may be formed.

The buffer wafer 100 may include a plurality of package regions P1 to P8 demarcated by scribe lines (SL). The plurality of package regions P1 to P8 may be arranged in a grid form (or a lattice form) defined by the scribe lines (SL). The plurality of package regions P1 to P8 may be aligned in a first direction X and a second direction Y.

The first direction X may be any one direction on a horizontal plane. The second direction Y may be any other direction different from the first direction X on the horizontal plane. For example, the first direction X and the second direction Y may be perpendicular to each other on the horizontal plane. A third direction Z may be a direction different from both the first direction X and the second direction Y. For example, the third direction Z may be a direction perpendicular to both the first direction X and the second direction Y provided on the horizontal plane. Thus, the first direction X, the second direction Y and the third direction Z may be orthogonal to one another.

In the example embodiment, the plurality of package regions may include eight package regions P1 to P8. However, the example embodiment is not limited thereto and these eight package regions P1 to P8 may be only segments of the plurality of package regions as shown in FIG. 1. Referring to FIG. 1, the first to fourth package regions P1 to P4 may be arranged in the first direction X. The fifth to eighth package regions P5 to P8 may also be arranged in the first direction X.

The first package region P1 and the fifth package region P5 may be arranged in the second direction Y. The second package region P2 and the sixth package region P6 may also be arranged in the second direction Y. The third package region P3 and the seventh package region P7 may also be arranged in the second direction Y. The fourth package region P4 and the eighth package region P8 may also be arranged in the second direction Y.

Although FIG. 1 illustrates that each row of the include two package regions or four package regions, this is an example, and the example embodiment is not limited thereto. That is, the number of the plurality of package regions may be changed based on design intent.

Referring to FIG. 2, the buffer wafer 100 may have a first thickness D1. The first thickness D1 may be, for example, 1 to 100 μm. However, the example embodiment is not limited thereto. The buffer wafer 100 may be relatively thinner than the carrier wafer 300. Therefore, the buffer wafer 100 may be cracked or damaged during the manufacturing process. To prevent this problem, the carrier wafer 300 may be coupled to the buffer wafer 100 through the glue layer 200 to form a first wafer supporting system 1000. Therefore, the durability of the buffer wafer 100 can be significantly improved during the manufacturing process of the semiconductor package.

The glue layer 200 may be disposed on the lower surface of the buffer wafer 100. A tacky semi-liquid is applied to the glue layer 200, and it may be cured later to bond the carrier wafer 300 and the buffer wafer 100. The glue layer 200 is generally applied evenly, but it may be uneven due to several factors.

The carrier wafer 300 may be attached below the buffer wafer 100 by the glue layer 200. The carrier wafer 300 may also be a circular wafer similar to the buffer wafer 100. However, a thickness of the carrier wafer 300 may be a second thickness D2 different from the first thickness D1 of the buffer wafer 100. According to the example embodiment of FIG. 2, the second thickness D2 may be greater than the first thickness D1. For example, the second thickness D2 may be 300 to 1000 μm. However, the example embodiment is not limited thereto. The carrier wafer 300 is a portion to be removed together with the glue layer 200 later in the manufacturing process, and may be configured to assist the durability of the buffer wafer 100.

The bump 110 may be located below the buffer wafer 100. A plurality of bumps 110 may be electrically connected to the stacked structures 410 to 440 formed above the buffer wafer 100 through the inside of the buffer wafer 100. The positions of the bumps 110 on the region of the lower surface of the buffer wafer 100 may correspond to a respective position of each of the plurality of package regions provided on the upper surface of the buffer wafer 100. Thus, for example, a bump 110 formed in the region corresponding to the first package region P1 and another bump 110 formed in the region corresponding to the second package region P2 may be separated and be insulated from each other.

The bump 110 includes a conductor material and may be surrounded by the glue layer 200. When the glue layer 200 is removed later, the bump 110 may be exposed to the outside from a bottom surface of the buffer wafer 100.

The first to fourth stacked structures 410 to 440 may be stacked in the first to fourth package regions P1 to P4, respectively. Specifically, the first stacked structure 410 is stacked in the first package region P1, and the second stacked structure 420 may be stacked in the second package region P2. The third stacked structure 430 may be stacked in the third package region P3, and the fourth stacked structure 440 may be stacked in the fourth package region P4.

The first to fourth stacked structures 410 to 440 may include a plurality of chips stacked in the third direction Z. Each of the plurality of chips may be electrically connected to one another, using through silicon vias (TSVs). However, the example embodiment is not limited thereto.

FIG. 2 illustrates four stacked structures disposed on the buffer wafer 100, however, the example embodiment is not limited thereto. That is, the number of stacked structures may be varied according to the design intent.

Referring to FIGS. 1 and 2, a first crack detection line 120 (or a first detection line 120) may be formed on the upper surface of the buffer wafer 100. The first crack detection line 120 may be a single wiring line. The first crack detection line 120 may be made of a conductor material. The first crack detection line 120 may be exposed from the upper surface of the buffer wafer 100 and may be covered with an insulating film.

The first crack detection line 120 may be formed to surround the periphery of the plurality of package regions P1 to P4. Because the plurality of package regions 410 to 440 are quadrilateral, the first crack detection line 120 may have a shape that surrounds four sides of the plurality of package regions.

Specifically, the first crack detection line 120 extends along the side surface of the first package region P1 in the second direction Y between the first package region P1 and the second package region P2, extends to bend in the first direction X again, and then may extend to bend in the second direction Y along the side surface of the first package region P1. Therefore, the first crack detection line 120 may include two parallel portions extending in the second direction Y between the first package region P1 and the second package region P2. The parallel portions may be connected by a portion extending in the first direction X.

Because the first crack detection line 120 needs to continue or extend as a single line, only the line in the second direction Y may be located on one side of each row of the plurality of package regions, and the two lines in the second direction Y may be disposed on the opposite side on each row. The two lines may or may not be parallel to each other.

For example, in FIG. 1, the first crack detection line 120 may extends in a line in the second direction Y on the left side of the first package region P1, and the first crack detection line 120 may extend in two rows in the second direction Y on the right side of the fourth package region P4. Of course, the two parallel lines on the right side of the fourth package region P4 may be connected by a portion extending in the first direction X.

Similarly, the first crack detection line 120 may extend in a line on the right side of the eighth package region P8 in the second direction Y, and the first crack detection line 120 may extend in two parallel lines on the left side of the fifth package region P5 in the second direction Y. Of course, the aforementioned two parallel lines on the left side of the fifth package region P5 may be connected by a portion extending in the first direction X.

As such, the portions extending in two parallel lines may be alternately arranged in the second direction Y. That is, in the first to fourth package regions P1 to P4, the portions extending in two parallel lines are located on the right side, and in the fifth to eighth package regions P5 to P8, the portions extending in two parallel lines may be located on the left side.

However, such a shape is only an example of the disclosure, and the example embodiment is not limited thereto.

The first pad 121 may be connected to one end of the first crack detection line 120. The second pad 122 may be connected to the other end opposite to the one end of the first crack detection line 120. That is, the first pad 121 and the second pad 122 may be connected to opposite ends of the first crack detection line 120. The first pad 121 and the second pad 122 may be exposed to the exterior of the buffer wafer 100.

At the time of crack detection, if a current is applied to the first crack detection line 120 with the two probes through the first pad 121 and the second pad 122, it is possible to check the presence or absence of the crack in the buffer wafer 100. If a crack occurs, the first crack detection line 120 may be opened and no current may flow through the first pad 121 and the second pad 122. Therefore, it is possible to determine the presence or absence of a crack in the buffer wafer 100.

In the semiconductor package process of the related art, a two dimensional (2D) vision inspection is performed immediately before the dicing process in order to determine the presence or absence of cracks in the buffer wafer 100, and subsequently, presence or absence of the defects in each individual package is detected through an electrical die sorting (EDS) test. In the related art, because a number of processes are performed prior to the EDS test without knowing the presence or absence of the crack occurring before the inspection, the waste of the process cost and time is considerable in the cases of the buffer wafer 100 including any crack.

Further, in the case of a vision inspection, because the inspection time is extensive and the sampling inspection is performed without inspecting all the buffer wafers, there is a possibility that the occurrence of a crack may not be detected, and there is a case of failing to detect a fine crack in the vision inspection.

The semiconductor package according to example embodiments can quickly detect a crack that occurs prior to the dicing process. Further, because the inspection may be repeatedly performed before the occurrence of the crack, it is possible to determine in which process the crack has occurred. This also makes it possible to improve the overall process of the semiconductor package process.

Also, because the inspection may proceed very quickly via the first crack detection line 120, a total inspection rather than the sampling inspection may be enabled. Therefore, the presence or absence of a crack can be determined more accurately.

Hereinafter, the semiconductor package according to example embodiments will be described with reference to FIGS. 3 and 4. Previously-described parts of the example embodiment will be simplified or omitted.

Figure 3:
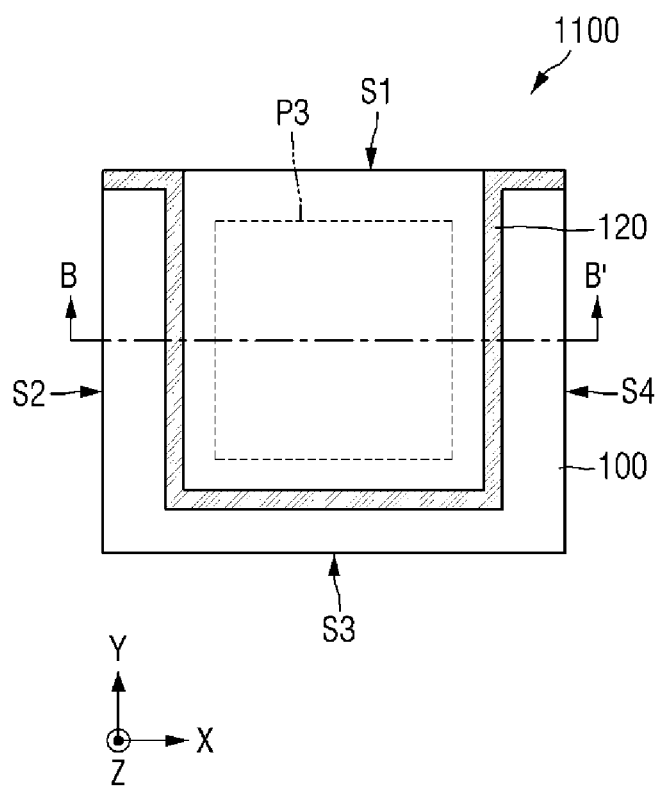
FIG. 3 is a plan view illustrating the semiconductor package diced along a scribe line of FIG. 1 according to an example embodiment.
Figure 4:
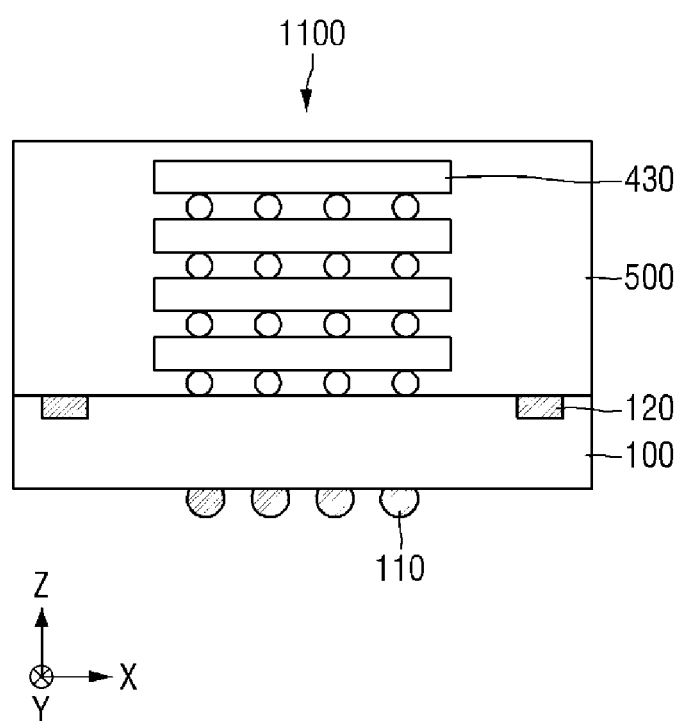
FIG. 4 is a cross-sectional view taken along the line B-B' of FIG. 3 according to an example embodiment.

FIG. 3 is a plan view illustrating a semiconductor package 1100 diced along the scribe lines of FIG. 1 according to an example embodiment, and FIG. 4 is a cross-sectional view taken along the line B-B' of FIG. 3 according to an example embodiment.

FIG. 3 is a diagram illustrating a diced portion of the third package region P3 of FIG. 1. Because all the plurality of package regions have the same shape after diced, for convenience, the third package region P3 is formed in FIG. 3 and the description of the other package regions will not be provided.

Referring to FIGS. 3 and 4, the semiconductor package 1100 according to an example embodiment may include a buffer wafer 100, a third stacked structure 430, a mold layer 500, bumps 110 and a first crack detection line 120.

The third stacked structure 430 may be stacked on the upper surface of the buffer wafer 100. The buffer wafer 100 may have a first side S1, a second side S2, a third side S3 and a fourth side S4. The first to fourth sides S1 to S4 may mean four side boundaries of the buffer wafer 100 of the semiconductor package 1100 diced into a quadrangle.

The third stacked structure 430 may be stacked on the semiconductor package 1100. The third stacked structure 430 may have a structure in which the plurality of chips are stacked.

The mold layer 500 may cover the upper surfaces of the third stacked structure 430 and the buffer wafer 100. The mold layer 500 may fill the side surfaces of the third stacked structure 430 and the gaps in the third stacked structure 430.

The mold layer 500 may be formed of, for example, a silicon-based material, a thermosetting material, a thermoplastic material, a UV treatment material, or the like. Alternatively, the mold layer 500 may be formed of a polymer such as resin and may be formed of, for example, an epoxy molding compound (EMC).

The mold layer 500 may cover the entire upper surface of the third stacked structure 430, or may expose at least a part of the upper surface of the third stacked structure 430 based on the design intent.

The bumps 110 may be formed to protrude on the lower surface of the buffer wafer 100. The bumps 110 may be electrically connected to the third stacked structure 430 through the buffer wafer 100. The bumps 110 are used for connecting the first semiconductor package 1100 to an external device or an external structure. The bumps 110 may include a conductor material.

The first crack detection line 120 may be disposed on the upper surface of the buffer wafer 100. Although the drawings illustrate that the first crack detection line 120 is embedded in the upper surface of the buffer wafer 100, the example embodiment is not limited thereto. For example, the first crack detection line 120 may be formed to protrude from the upper surface of the buffer wafer 100.

For the first crack detection line 120 is not involved in driving the third stacked structure 430, the first crack detection line 120 may be insulated and separated from the third stacked structure 430.

The first crack detection line 120 is used for testing before dicing, and is not actually used in the diced first semiconductor package 1100. The first crack detection line 120 may extend to the end of the first semiconductor package 1100, i.e., an end of the buffer wafer 100.

That is, the first crack detection line 120 may extend to the second side S2 and the fourth side S4 in FIG. 3. This is because the first crack detection line 120 intersects the scribe line SL of FIG. 1 before dicing of the buffer wafer 100.

In FIG. 3, although the first crack detection line 120 extends to the second side S2 and the fourth side S4, it is merely an example, and the example embodiment is not limited thereto. The first crack detection line 120 may be in contact with at least one of the first side S1, the second side S2, the third side S3 and the fourth side S4. As shown in FIG. 3, a shape of the first crack detection line 120 has a bilateral symmetry.

In this example embodiment, because the presence or absence of a crack of the semiconductor package 1100 can be easily detected in advance by this inspection having a short turn-around time, the semiconductor package 1100 with higher reliability can be manufactured.

Hereinafter, a wafer supporting system 1000 of a semiconductor package according to example embodiments will be described with reference to FIGS. 5 and 6. Previously described parts of the above-described example embodiments will be simplified or omitted.

Figure 5:
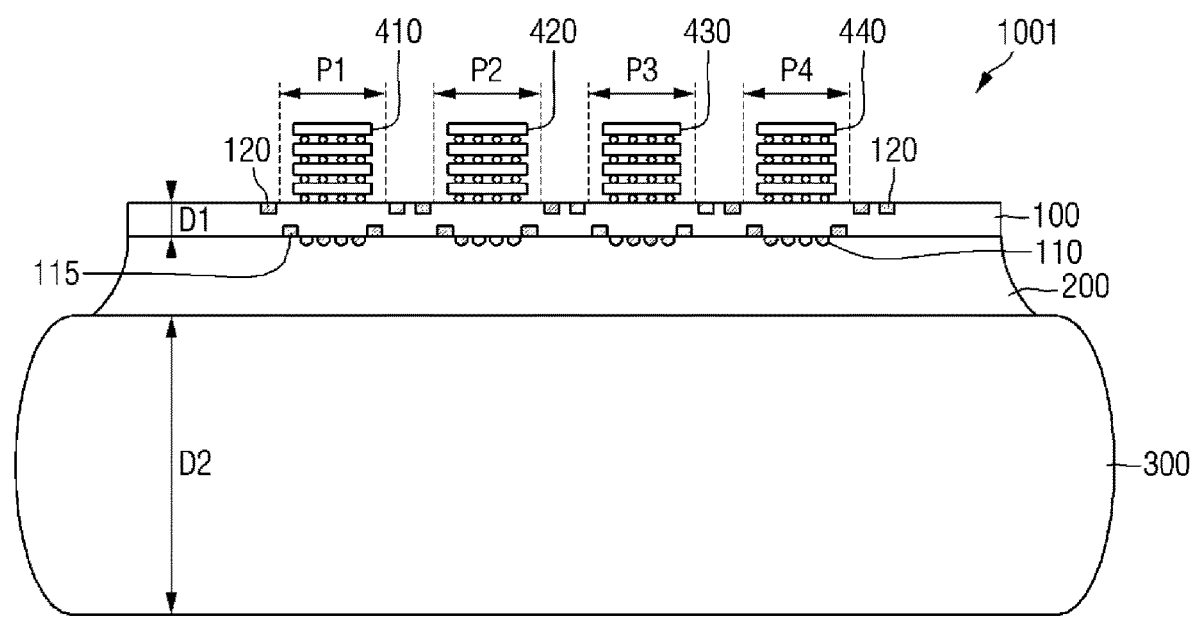
FIG. 5 is a cross-sectional view illustrating the wafer supporting system of the semiconductor package according to an example embodiment.

FIG. 5 is a cross-sectional view of a wafer supporting system 1001 of a semiconductor package according to an example embodiment.

Referring to FIG. 5, a wafer supporting system 1001 of a semiconductor package according to another example embodiment further includes a second crack detection line 115.

The second crack detection line 115 may be disposed on the lower surface of the buffer wafer 100. The second crack detection line 115 is a wiring line for inspecting individual packages, that is, a single package region such as a first package region P1, a second package region P2, a third package region P3 and a fourth package region P4 is individually inspected via the second crack detection line 115.

That is, the second crack detection line 115 may be used to individually inspect the first stacked structure 410, the second stacked structure 420, the third stacked structure 430 and the fourth stacked structure 440 provided on the first package region P1, the second package region P2, the third package region P3 and the fourth package region P4, respectively, after the glue layer 200 and the carrier wafer 300 are removed by de-bonding from the buffer wafer 100.

Therefore, the second crack detection line 115 may be, for example, a chipping detect circuit (CDC), and a wiring line for testing a defect of the individual semiconductor package.

The second crack detection line 115 is a line for precisely detecting the individual semiconductor package after de-bonding of the glue layer 200 and the carrier wafer 300 from the buffer wafer 100, and is divvied for each semiconductor package. Therefore, it is possible to quickly detect the existence of cracks via the first crack detection line 120, and the defects of the individual semiconductor package can be accurately detected via the second crack detection line 115. Through this, the second wafer supporting system 1001 of the semiconductor package according to the example embodiment can provide a highly reliable semiconductor package defect determination.

Figure 6:
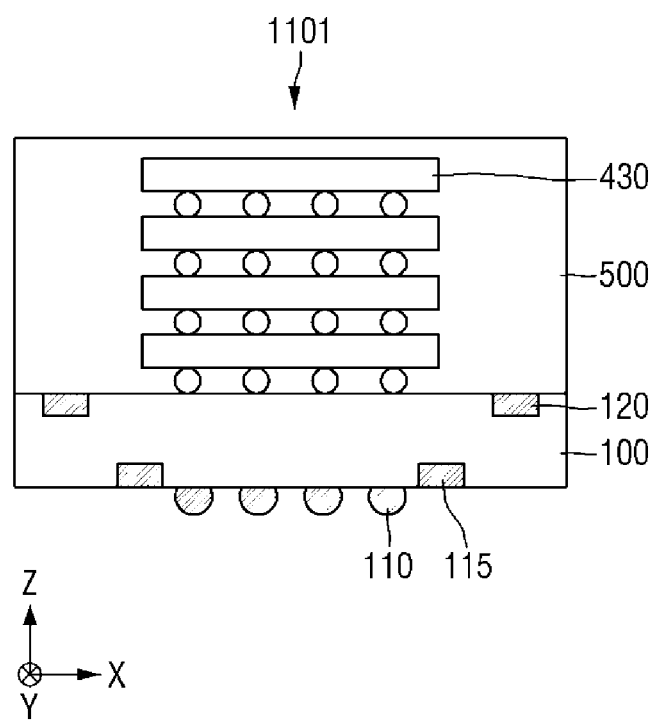
FIG. 6 is a cross-sectional view illustrating a semiconductor package obtained by dicing the wafer supporting system of FIG. 5 according to an example embodiment.

FIG. 6 is a cross-sectional view illustrating a semiconductor package 1101 obtained by dicing the wafer supporting system 1001 of FIG. 5.

Referring to FIG. 6, a semiconductor package 1101 may include a second crack detection line 115 provided in a lower portion of the buffer wafer 100, and the second crack detection line 115 may not extend out to the side surface end of the second semiconductor package 1101, unlike the first crack detection line 120 shown in FIG. 3.

Hereinafter, a wafer supporting system of the semiconductor package 1102 according to example embodiments will be described with reference to FIGS. 1 and 7. Previously described parts of the above-described example embodiments will be simplified or omitted.

Figure 7:
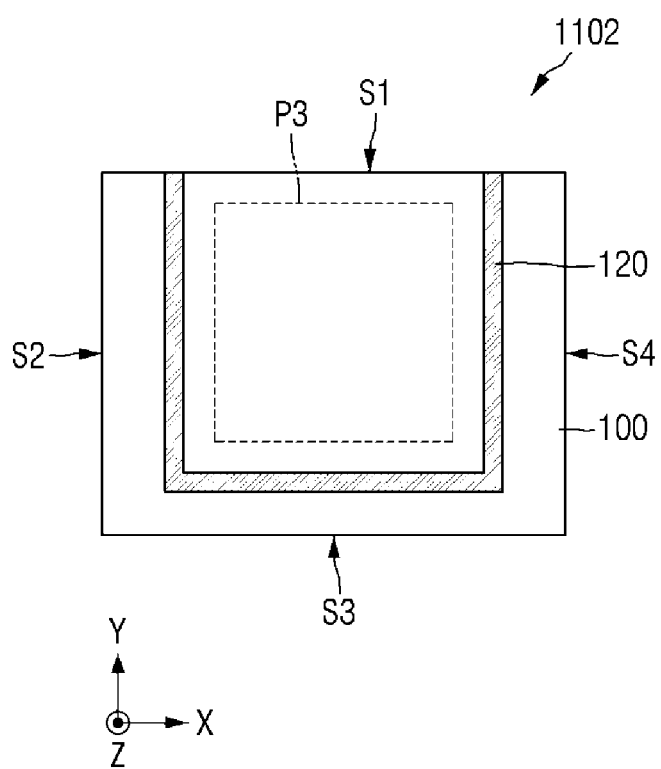
FIG. 7 is a plan view illustrating the semiconductor package according to an example embodiment.

FIG. 7 is a plan view of a semiconductor package 1102 according to an example embodiment.

Referring to FIGS. 1 and 7, the shape of the first crack detection line 120 of a semiconductor package 1102 surrounds the three sides of the third package region P3 (having a quadrilateral shape) and extends to the first side S1. When the buffer wafer 100 (FIG. 1) is diced in accordance with the scribe lines SL, if the dicing surface is cut a bit deeper into the semiconductor package 1102, a part of the first crack detection line 120 is removed, and the shape like FIG. 7 may remain. Nevertheless, the first crack detection line 120 may extend to the first end S1.

Hereinafter, a wafer supporting system of a semiconductor package 103 according to an example embodiment will be described with reference to FIGS. 1 and 8. Previously described parts of the above-described example embodiments will be simplified or omitted.

Figure 8:
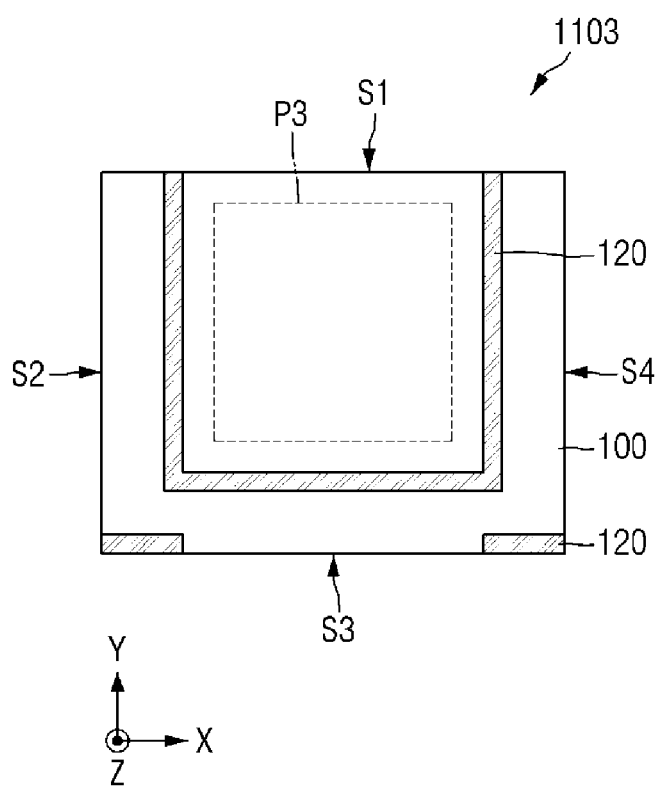
FIG. 8 is a plan view illustrating the semiconductor package according to an example embodiment.

FIG. 8 is a plan view of a semiconductor package 1103 according to an example embodiment.

Referring to FIGS. 1 and 8, a semiconductor package 1103 may include a plurality of portions separated from each other according to the position of the scribe line SL and the shape and the position of the first crack detection line 120 with respect to the semiconductor package 1103 and the adjacent semiconductor packages.

Specifically, the semiconductor package 1103 shown in FIG. 8 may include a portion that surrounds the three sides of the third package region P3 and is in contact with the first side S1, a portion being in contact with a corner in which the second side S2 and the third side S3 meet, and a portion being in contact with a corner in which the third side S3 and the fourth side S4 meet. All the aforementioned portions were connected before dicing, but may be all separated after dicing.

Hereinafter, a wafer supporting system 1002 of a semiconductor package according to an example embodiment will be described with reference to FIG. 9. Previously described parts of the above-described example embodiments will be simplified or omitted.

Figure 9:
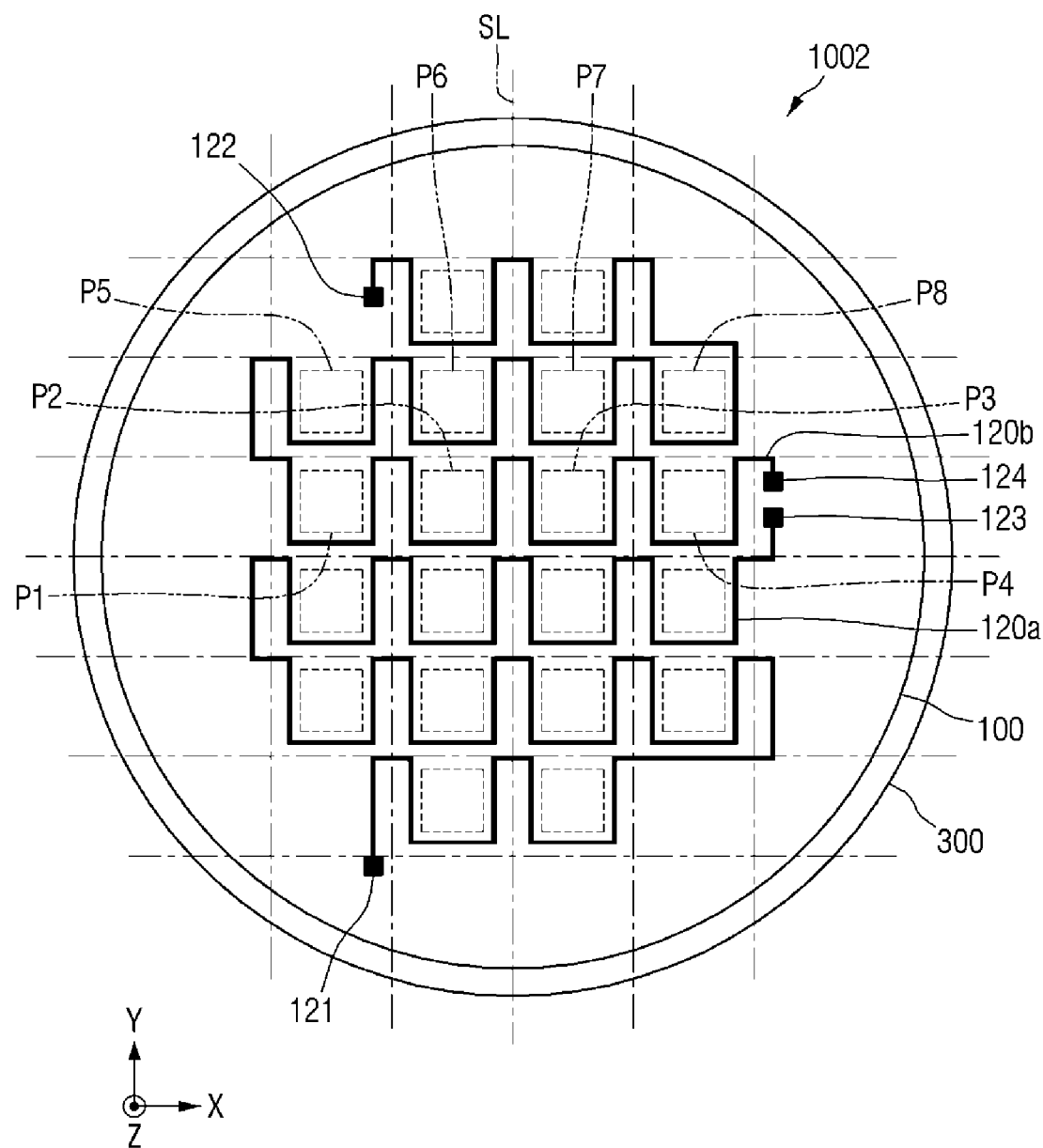
FIG. 9 is a plan view illustrating the wafer supporting system of the semiconductor package according to an example embodiment.

FIG. 9 is a plan view illustrating a wafer supporting system 1002 of a semiconductor package according to an example embodiment.

Referring to FIG. 9, a wafer supporting system 1002 of a semiconductor package according to an example embodiment may include separate a first-half crack detection line 120a and a second-half crack detection line 120b rather than a single crack detection line.

The first-half crack detection line 120a may be connected to the first pad 121 and the third pad 123 at opposite ends, respectively. The second-half crack detection line 120b may be connected to the second pad 122 and the fourth pad 124 at opposite ends, respectively.

The first-half and second-half crack detection lines 120a and second-half crack detection lines 120b may individually detect a crack of the buffer wafer 100 by two detections, respectively. Therefore, it is possible to roughly determine the position at which the crack occurs. For example, when a crack is detected by the first-half crack detection line 120a, it is possible to determine that a crack has occurred at the position at which the first-half crack detection line 120a is formed. Similarly, when a crack is detected by the second-half crack detection line 120b, it is possible to determine that a crack has occurred at the position at which the second-half crack detection line 120b is formed.

The wafer supporting system 1002 of the semiconductor package according to the example embodiment can detect a crack quickly and easily, and at the same time, can also narrow the position of the crack. Although two regions are set using the two crack detection lines in FIG. 9, this is only an example, and the number of crack detection lines may vary. For example, in the case of incorporating four crack detection lines, the four regions may be divided to detect a crack.

Hereinafter, a wafer supporting system 1003 of a semiconductor package according to an example embodiment will be described with reference to FIG. 10. Previously described parts of the above-described example embodiments will be simplified or omitted.

Figure 10:
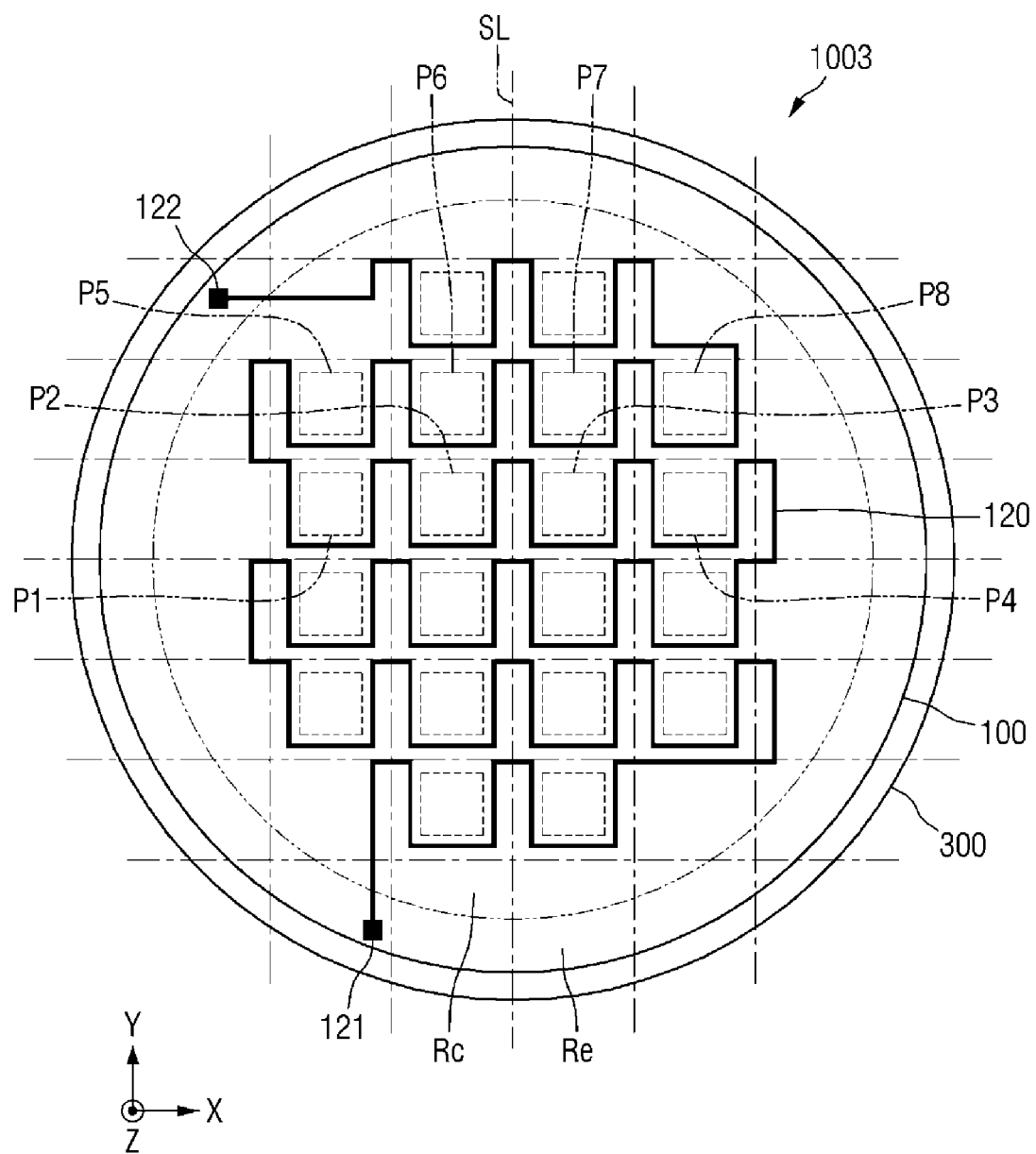
FIG. 10 is a plan view illustrating the wafer supporting system of the semiconductor package according to an example embodiment.

FIG. 10 is a plan view of a wafer supporting system 1003 of a semiconductor package according to an example embodiment.

Referring to FIG. 10, a buffer wafer 100 of the wafer supporting system 1003 of the semiconductor package according to an example embodiment includes a center region Rc and an edge region Re on the upper surface.

The center region Rc may be located at the center portion of the upper surface of the buffer wafer 100, and the edge region Re may be an edge region which surrounds the center region Rc. The center region Rc may be a region in which the mold layer (e.g., a mold layer 500 shown in FIG. 4) is formed. The mold layer may cover all of the plurality of package regions located in the center region Rc, and may expose the edge region Re.

The first pad 121 and the second pad 122 connected to the first crack detection line 120 are both disposed in the edge region Re out of the center region Rc. That is, the first crack detection line 120 extends out from the center region Rc and is connected to the first pad 121 and the second pad 122 in the edge region Re.

As a result, even after the mold layer is formed, the first pad 121 and the second pad 122 are exposed to the outside, and the presence or absence of a crack can be detected, using the first crack detection line 120. According to the example embodiment, because cracks occurring after the molding process can also be detected by the first crack detection line 120 via the first pad 121 and the second pad 122, it is possible to further improve the reliability and minimize waste of the manufacturing costs and time.

Hereinafter, a wafer supporting system 1004 of a semiconductor package according to an example embodiment will be described with reference to FIG. 11. Previously described parts of the above-described example embodiments will be simplified or omitted.

Figure 11:
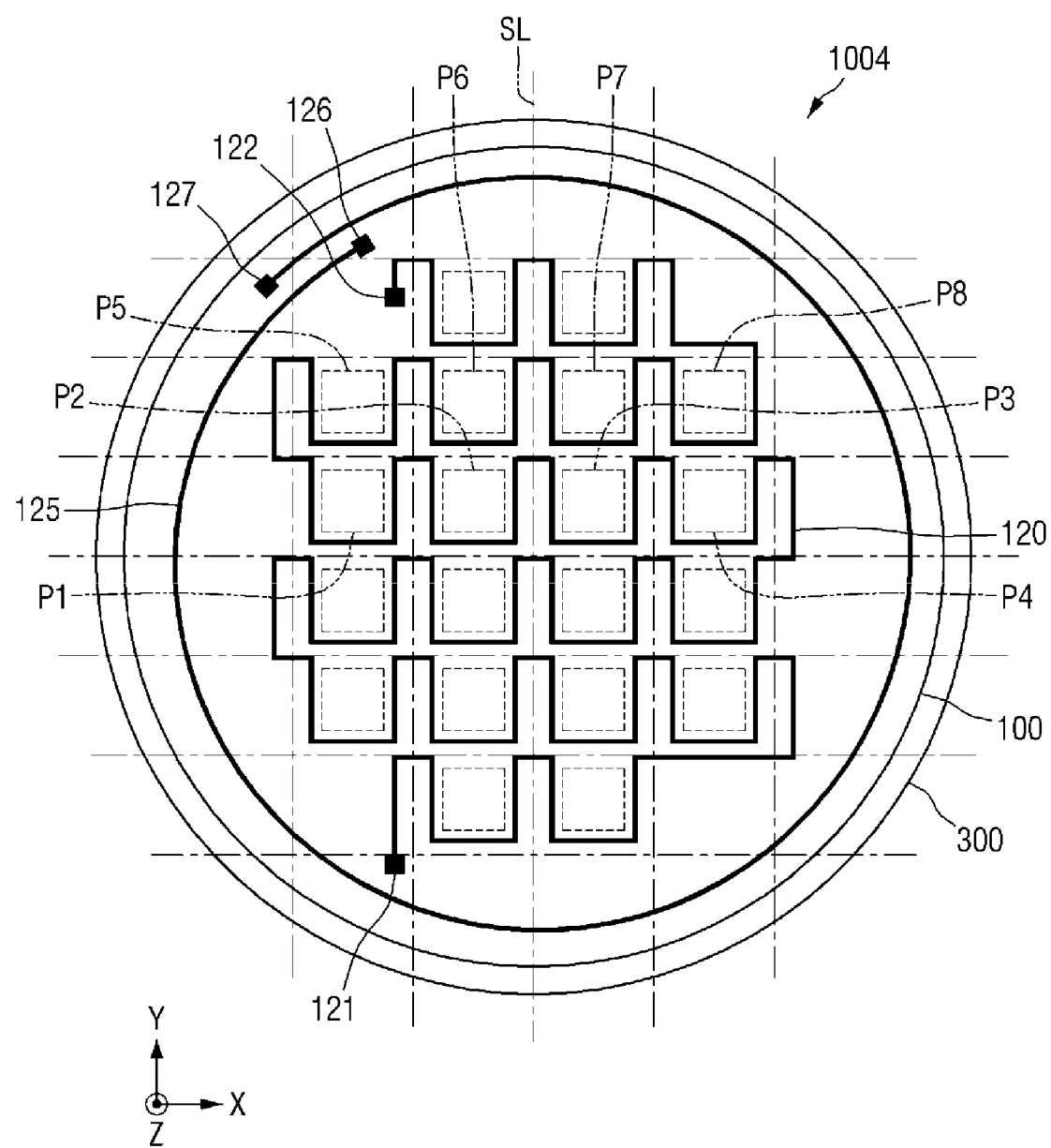
FIG. 11 is a plan view illustrating the wafer supporting system of the semiconductor package according to an example embodiment.

FIG. 11 is a plan view of a wafer supporting system 1004 of the semiconductor package according to an example embodiment.

Referring to FIG. 11, a wafer supporting system 1004 of a semiconductor package according to an example embodiment includes an edge crack detection line 125 in addition to a first crack detection line 120.

The edge crack detection line 125 may be located on the upper surface of the buffer wafer 100 similar to the first crack detection line 120. The edge crack detection line 125 may be disposed to surround the interior in which the first crack detection line 120 and the plurality of package regions are formed. The edge crack detection line 125 may be formed along the edge of the circular buffer wafer 100. However, because a fifth pad 126 and a sixth pad 127 are connected to opposite ends of the edge crack detection line 125 for testing, a closed loop may not be formed on the edge crack detection line 125.

The edge crack detection line 125 may apply a current to the fifth pad 126 and the sixth pad 127 to easily detect a crack in a portion in which the edge crack detection line 125 passes in a short time.

Both ends of the edge crack detection line 125 may partially overlap each other along the edge region to cover the entire edge portion of the buffer wafer 100. However, the overlapping portions of the edge crack detection line 125 may not be in contact with each other.

The edge portion of the buffer wafer 100 may be a portion in which a crack occurs more easily than other portions. Furthermore, because such a crack may grow gradually from the edge portion to the inside, detection of the cracks in the edge portion may be very important in the semiconductor package process.

Because the semiconductor package according to the example embodiment includes both the first crack detection line 120 for detecting a crack inside (i.e., the center portion in a plane view) and the edge crack detection line 125 for detecting a crack at an edge portion, it is possible to detect occurrence of crack in advance and greatly improve the reliability of the completed semiconductor package.

Hereinafter, a wafer supporting system 1005 of a semiconductor package according to an example embodiment will be described with reference to FIG. 12. Previously described parts of the above-described example embodiments will be simplified or omitted.

Figure 12:
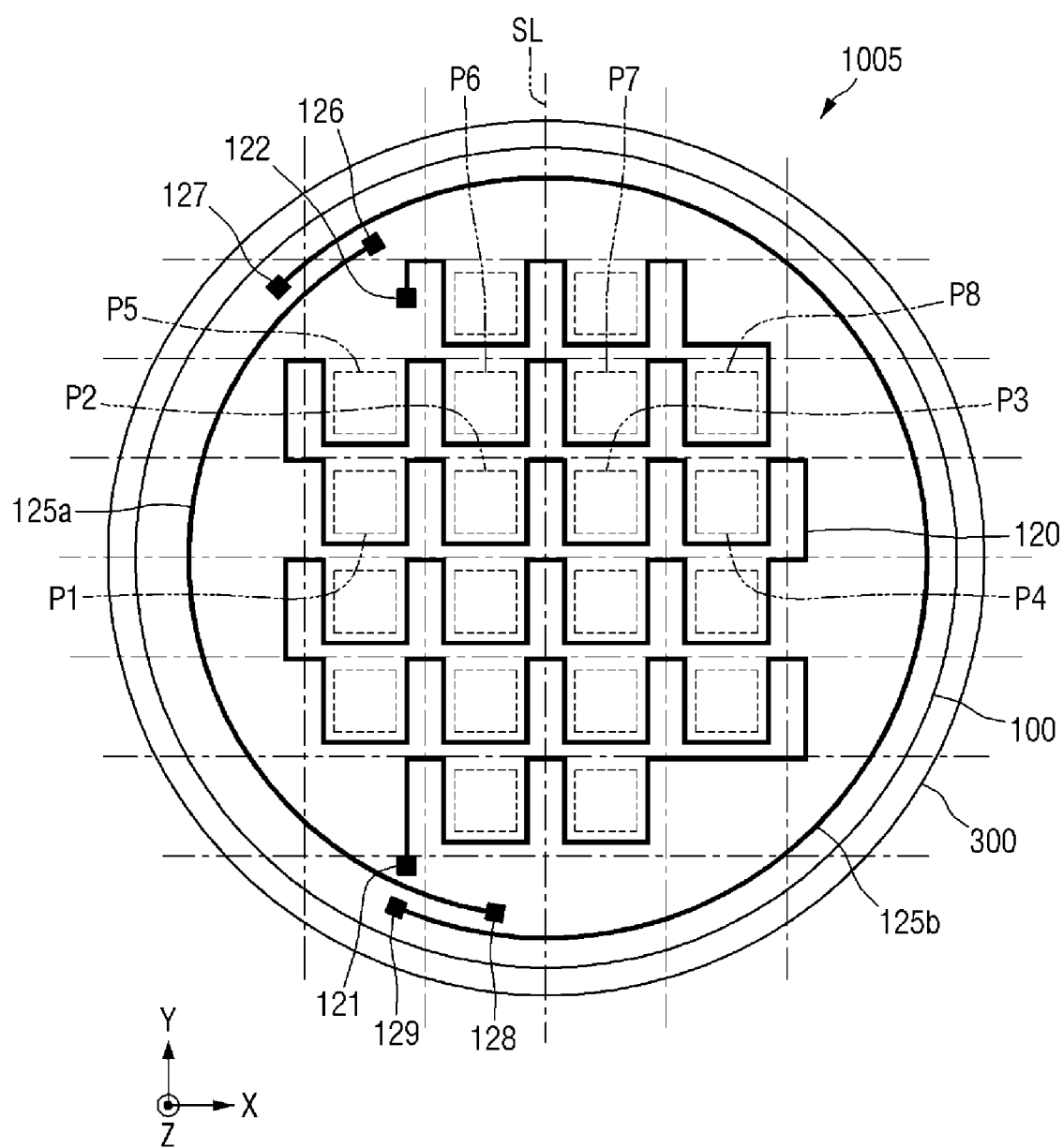
FIG. 12 is a plan view illustrating the wafer supporting system of the semiconductor package according to an example embodiment.

FIG. 12 is a plan view of a wafer supporting system 1005 of a semiconductor package according to an example embodiment.

Referring to FIG. 12, a wafer supporting system 1005 of a semiconductor package according to an example embodiment includes a first edge crack detection line 125a and a second edge crack detection line 125b in addition to a first crack detection line 120.

The first edge crack detection line 125a may cover only a part of the edge portion of the buffer wafer 100. The first edge crack detection line 125a may be connected to the fifth pad 126 and the seventh pad 128 at opposite ends, respectively. The first edge crack detection line 125a may apply a current to the fifth pad 126 and the seventh pad 128 to easily detect the presence or absence of a crack of a region in which the first edge crack detection line 125a passes in a short time.

The second edge crack detection line 125b may cover the remaining portion of the edge portion of the buffer wafer 100 that is not covered by the first edge crack detection line 125a. The second edge crack detection line 125b may be connected to a sixth pad 127 and an eighth pad 129 at opposite ends, respectively. The second edge crack detection line 125b may apply a current to the sixth pad 127 and the eighth pad 129 to easily detect the presence or absence of a crack in a region in which the first edge crack detection line 125a passes in a short time.

The first edge crack detection line 125a and the second edge crack detection line 125b may overlap each other such that there is no uncovered portion of the edge portion. Specifically, the portion of the first edge crack detection line 125a adjacent to the fifth pad 126 and the portion of the second edge crack detection line 125b adjacent to the sixth pad 127 may overlap each other along the edge portions. In addition, the portion of the first edge crack detection line 125a adjacent to the seventh pad 128 and the portion of the second edge crack detection line 125b adjacent to the eighth pad 129 may overlap each other along the edge portions.

The semiconductor package of the wafer supporting system 1005 according to the example embodiment may inform in which portion of the edge a crack has occurred. For example, when a current is applied to the first edge crack detection line 125a but the current does not flow normally, it is possible to know that a crack is present in a region in which the first edge crack detection line 125a is formed.

Thus, the semiconductor package according to the example embodiment may more accurately detect the occurrence of the crack, and may determine the approximate position of the crack.

Although FIG. 12 illustrates an example in which there are two edge crack detection lines, this is only an example, and the example embodiment is not limited thereto. For example, the number of edge crack detection lines may vary. As the number of edge crack detection lines increases, information on the locations of the cracks may become more precise.

Hereinafter, a wafer supporting system 1006 of a semiconductor package according to an example embodiment will be described with reference to FIGS. 13 and 14. Previously described parts of the above-described example embodiments will be simplified or omitted.

Figure 13:
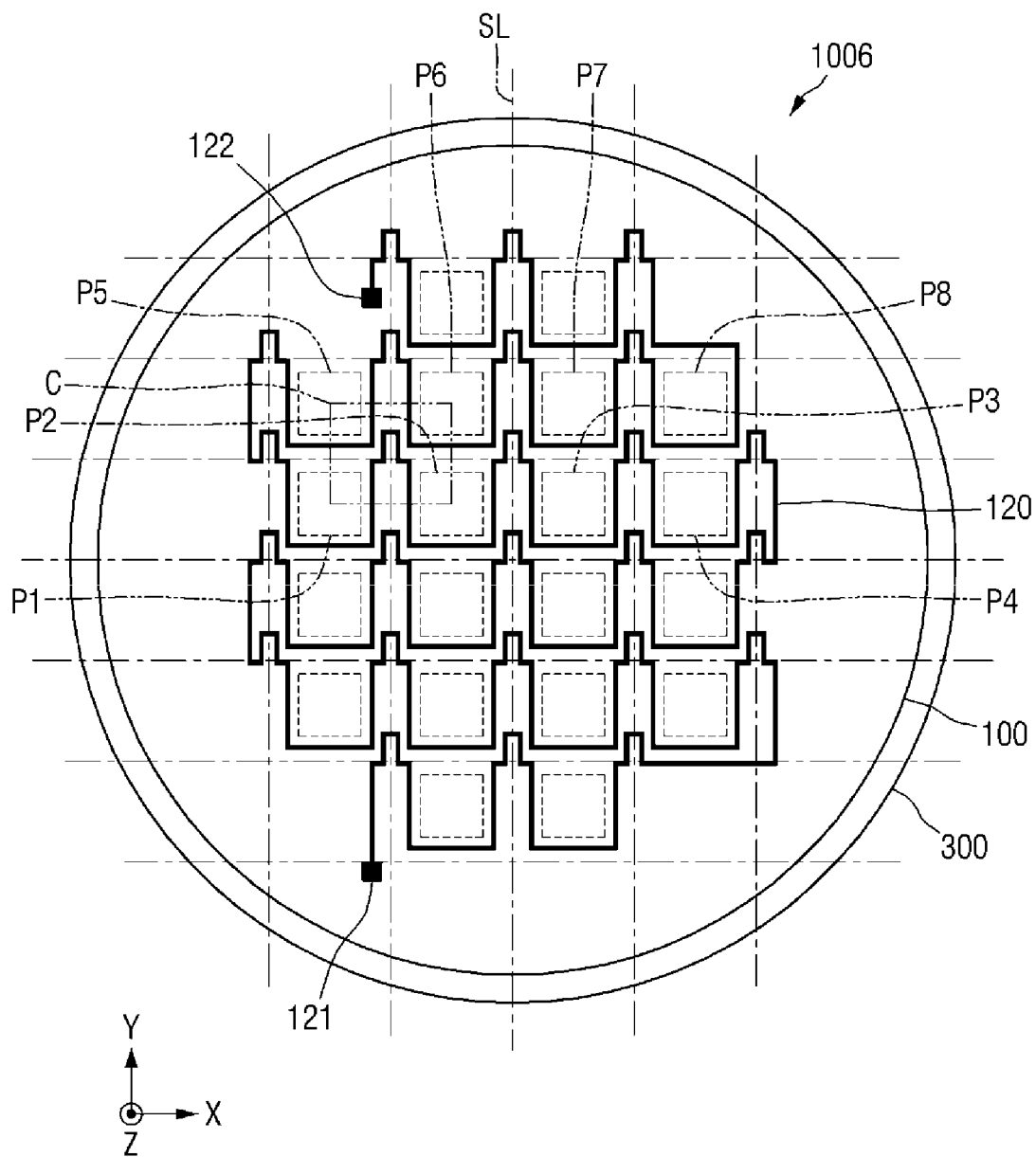
FIG. 13 is a plan view illustrating the wafer supporting system of the semiconductor package according to an example embodiment.
Figure 14:
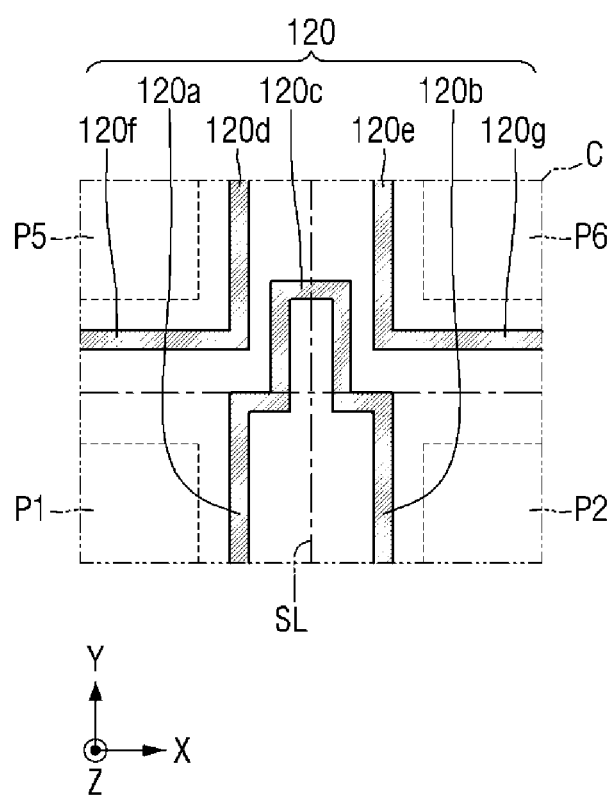
FIG. 14 is an enlarged plan view of a part C of FIG. 13.

FIG. 13 is a plan view illustrating a wafer supporting system 1006 of a semiconductor package according to an example embodiment, and FIG. 14 is an enlarged plan view of a portion C of FIG. 13.

Referring to FIGS. 13 and 14, a first crack detection line 120 of a wafer supporting system 1006 of a semiconductor package according to an example embodiment may include a protrusion so that straight cracks extending between rows of the plurality of package regions P1 to P8 can be detected.

Specifically, portions of the first crack detection line 120 formed around the first to fourth package regions P1 to P4 may overlap portions of the first crack detection line 120 formed around the fifth to eighth package regions P5 to P8 in the first direction X.

Taking the portion C of FIG. 14 as an example, the first crack detection line 120 between the first package region P1 and the second package region P2 includes a first portion 120a and a second portion 120b extending in the second direction Y, and a third portion 120c which connects the first portion 120a and the second portion 120b.

The first portion 120a may be disposed adjacent to the first package region P1 and may extend in the second direction Y. At this time, the first portion 120a also includes one that obliquely extends with the component of the second direction Y. The first portion 120a does not necessarily need to have a linear shape, but may also have a curvilinear shape.

The second portion 120b may be disposed adjacent to the second package region P2 and may extend in the second direction Y. The second portion 120b also does not necessarily need to have a linear shape, but may also have a curvilinear shape.

The third portion 120c may be a portion that connects the first portion 120a and the second portion 120b. The third portion 120c may include a protrusion protruding in the second direction Y in the middle portion between the first portion 120a and the second portion 120b, rather than extending only in the first direction X to connect the first portion 120a and the second portion 120b. Accordingly, the protrusion may be located between the fifth package region P5 and the sixth package region P6 in the first direction X. The third portion 120c also does not necessarily need to have a linear shape, and may also have a curvilinear shape.

Meanwhile, the first crack detection line 120 further includes a fourth portion 120d and a fifth portion 120e between the fifth package region P5 and the sixth package region P6.

The fourth portion 120d may be disposed adjacent to the fifth package region P5 and may extend in the second direction Y. The fourth portion 120d also does not necessarily need to have a linear shape, but may also have a curvilinear shape.

The fourth portion 120d may be connected to the sixth portion 120f. The sixth portion 120f may extend in the first direction X along the lower portion of the fifth package region P5 with reference to FIG. 14. The sixth portion 120f also does not necessarily need to have a linear shape, but also may have a curvilinear shape.

The fifth portion 120e may be disposed adjacent to the sixth package region P6 and may extend in the second direction Y. The fifth portion 120e also does not necessarily need to have a linear shape, but may also have a curvilinear shape.

The fifth portion 120e may be connected to the seventh portion 120g. The seventh portion 120g may extend in the first direction X along the lower portion of the sixth package region P6 with reference to FIG. 14. The seventh portion 120g also does not necessarily need to have a linear shape, but may also have a curvilinear shape.

The third portion 120c may overlap the fourth portion 120d and the fifth portion 120e in the first direction X, between the fifth package region P5 and the sixth package region P6. Through this, the seventh wafer supporting system 1006 of the semiconductor wafer according to the example embodiment can detect the crack extending in the first direction X, between the first to fourth package regions P1 to P4 and the fifth to eighth package regions P5 to P8. Therefore, the wafer supporting system 1006 according to the example embodiment may provide a more reliable semiconductor package.

Hereinafter, 1 semiconductor package 1104 according to an example embodiment will be described with reference to FIG. 15. Previously described parts of the above-described example embodiments will be simplified or omitted.

Figure 15:
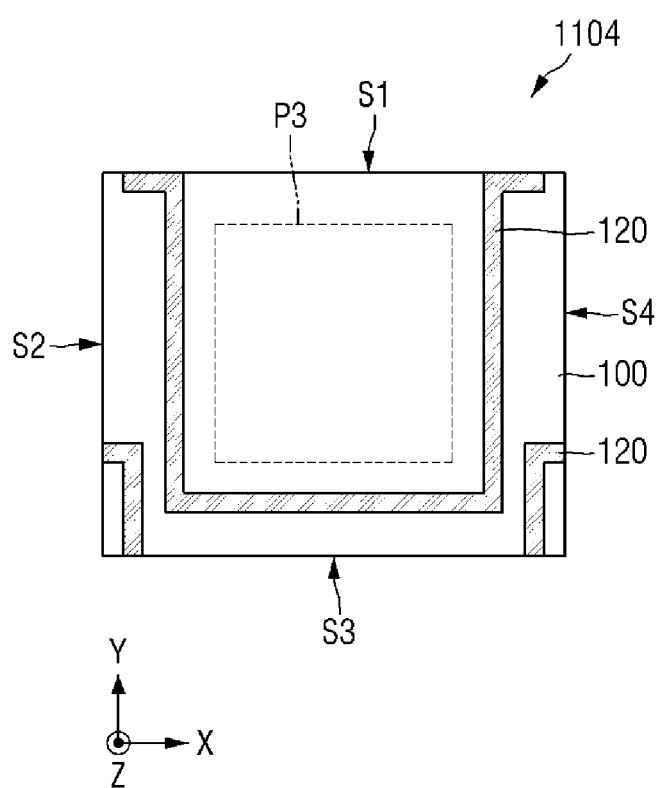
FIG. 15 is a plan view illustrating the semiconductor package according to an example embodiment.

FIG. 15 is a plan view of a semiconductor package 1104 according to an example embodiment.

Referring to FIG. 15, a semiconductor package 1104 according to an example embodiment may include first crack detection lines 120 separated from each other. The fifth semiconductor package 1104 may be a semiconductor package after the wafer supporting system 1006 of FIGS. 13 and 14 is diced.

The first crack detection line 120 of the semiconductor package 1104 in FIG. 15 may include a portion being in contact with the first side S1 and surrounding three sides of the third package region P3 (having a quadrilateral shape). Further, the first crack detection line 120 may include a portion being in contact with the second side S2 and the third side S3, and a portion being in contact with the third side S3 and the fourth side S4. That is, the semiconductor package 1104 in this example embodiment may include three first crack detection lines 120 separated from one another.

This embodiment having three first crack detection lines 120 separated from one another may be attributed to the protrusion of the first crack detection line 120 of the wafer supporting system 1006 of FIGS. 13 and 14. The arrangement shape of the first crack detection line 120 of the semiconductor package 1104 may vary, depending on the position of the scribe lines SL and the position and the shape of the first crack detection line 120 of FIG. 13. For example, the semiconductor package 1104 may include only a single connected first crack detection line 120 rather than the first crack detection line 120 separated into three portions. In any case, the first crack detection line 120 may extend to at least one end.

Hereinafter, a method of manufacturing a semiconductor package according to example embodiments will be described with reference to FIGS. 1, 2 and 16 to 23. Previously described parts of the above-described example embodiments will be simplified or omitted.

Figure 16:
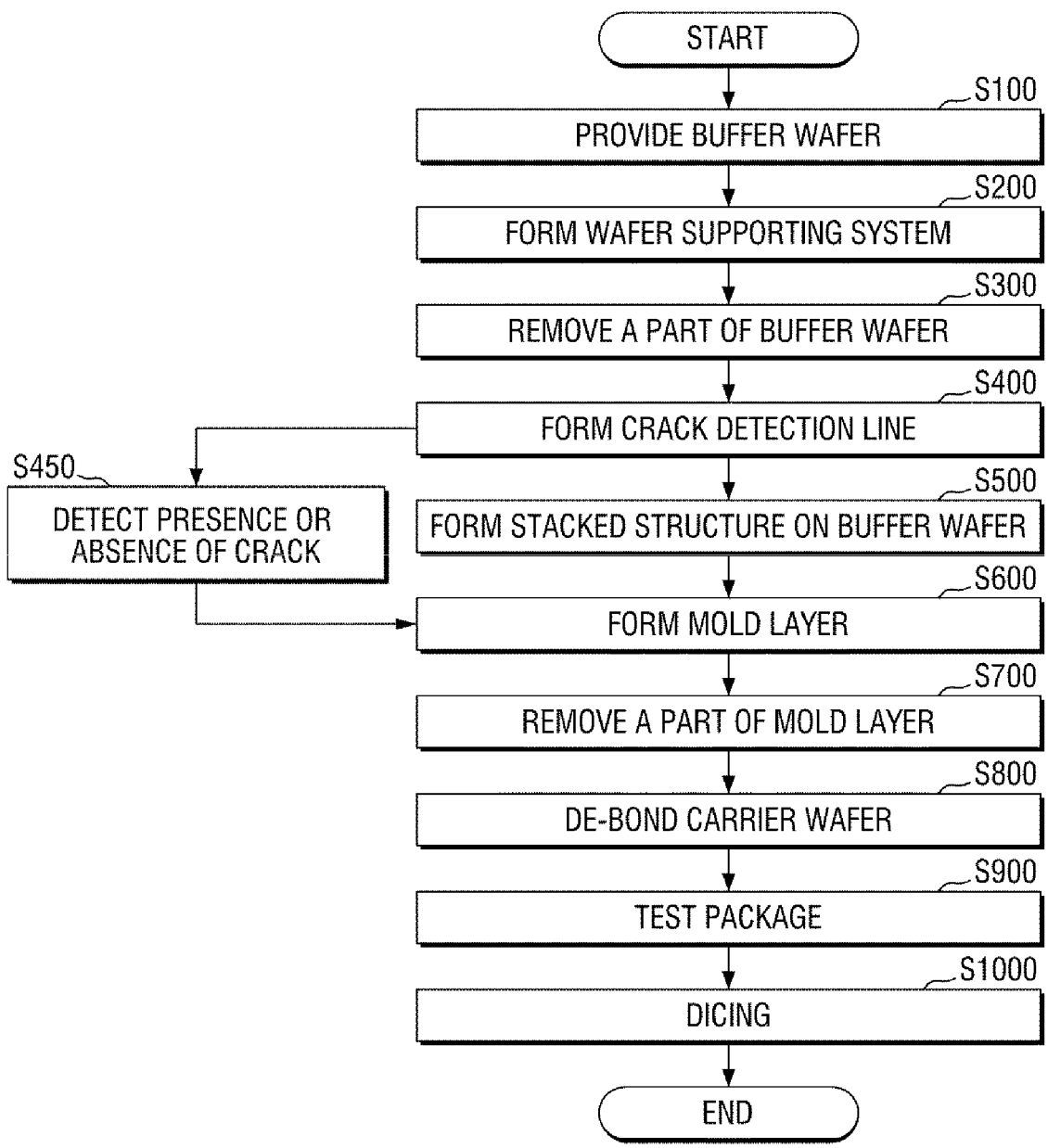
FIG. 16 is a flowchart illustrating a method of manufacturing a semiconductor package according to an example embodiment.

FIG. 16 is a flowchart illustrating a method of manufacturing a semiconductor package according to an example embodiment, and FIGS. 17 to 23 are drawings illustrating various intermediate stages in a method of manufacturing a semiconductor package according to an example embodiment.

First, referring to FIG. 16, a buffer wafer 100 is provided (S100).

Figure 17:
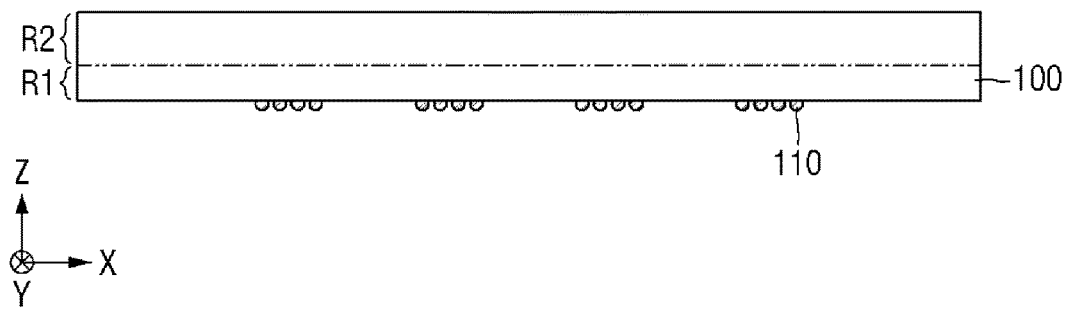
FIGS. 17 to 23 are intermediate stage diagrams illustrating the method of manufacturing the semiconductor package according to some embodiments.

Specifically, referring to FIG. 17, a buffer wafer 100 includes a first region R1 and a second region R2. The first region R1 is a portion to be used later, and the second region R2 is a portion to be removed. The second region R2 may be disposed on the first region R1. The first region R1 and the second region R2 may be portions integrally adhered to each other.

The buffer wafer 100 may include a plurality of bumps 110 protruding from the lower surface. The plurality of bumps 110 may be electrically connected to the stacked structures which are to be stacked on the upper surface of the buffer wafer 100 later. The plurality of bumps 110 may be formed in the region corresponding to the placement of the stacked structures to be stacked on the upper surface of the buffer wafer 100 later.

Referring back to FIG. 16, a wafer supporting system 1000 is formed (S200).

Figure 18:
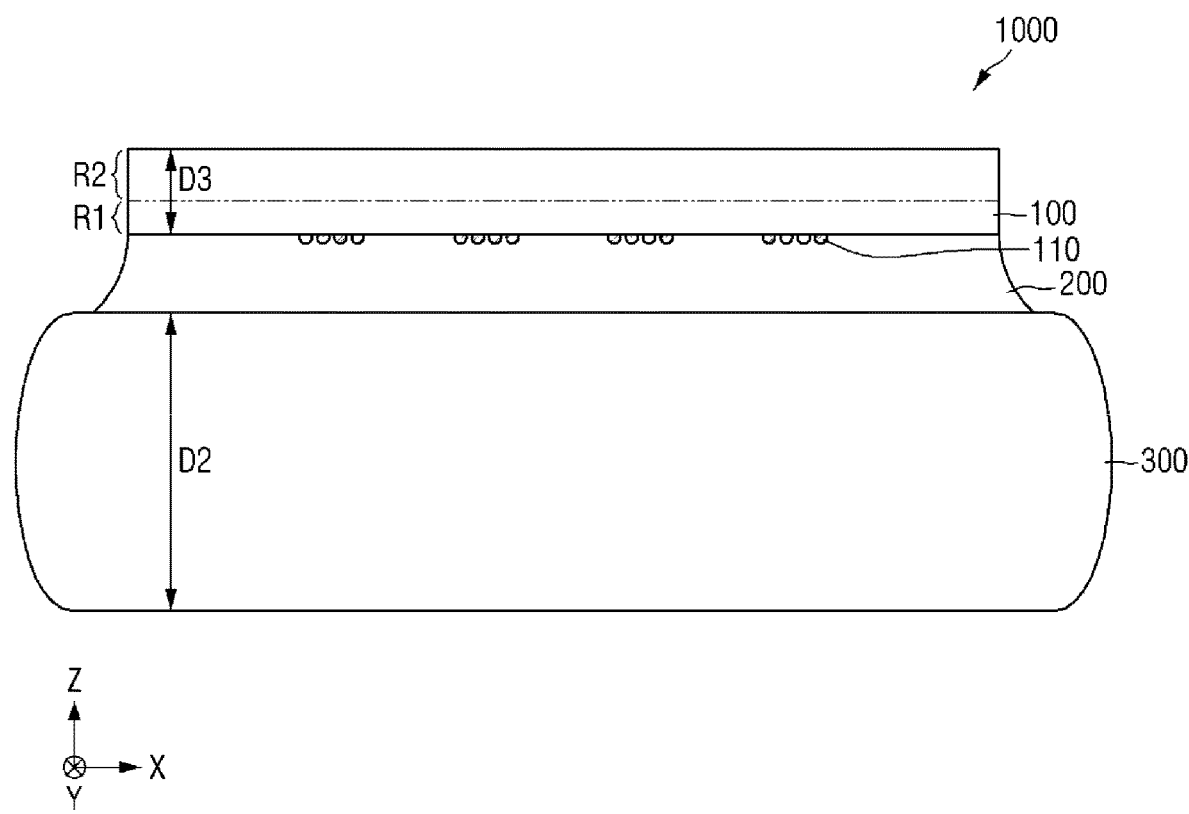

Specifically, referring to FIG. 18, the wafer supporting system 1000 includes the buffer wafer 100, a glue layer 200, and a carrier wafer 300.

The glue layer 200 may be located on the lower surface of the buffer wafer 100. A tacky semi-liquid is applied to the glue layer 200, and the glue layer 200 may be cured later to bond the carrier wafer 300 and the buffer wafer 100. The glue layer 200 is generally applied evenly, but may be uneven due to several factors.

The carrier wafer 300 may be attached below the buffer wafer 100 by the glue layer 200. The carrier wafer 300 may also be a circular wafer like the buffer wafer 100. The thickness of the carrier wafer 300 may be a second thickness D2.

The buffer wafer 100 may be of a third thickness D3. The third thickness D3, for example, may be smaller than the second thickness D2.

The carrier wafer 300 is a portion to be removed together with the glue layer 200 in the later process, and may be configured to assist the durability of the buffer wafer 100 during the manufacturing process.

The plurality of bumps 110 include a conductor material, and may be encapsulated by the glue layer 200. When the glue layer 200 is removed later, the plurality of bumps 110 may be exposed to the exterior of the buffer wafer 100.

Referring back to FIG. 16, a part of a buffer wafer 100 is removed (S300).

Figure 19:
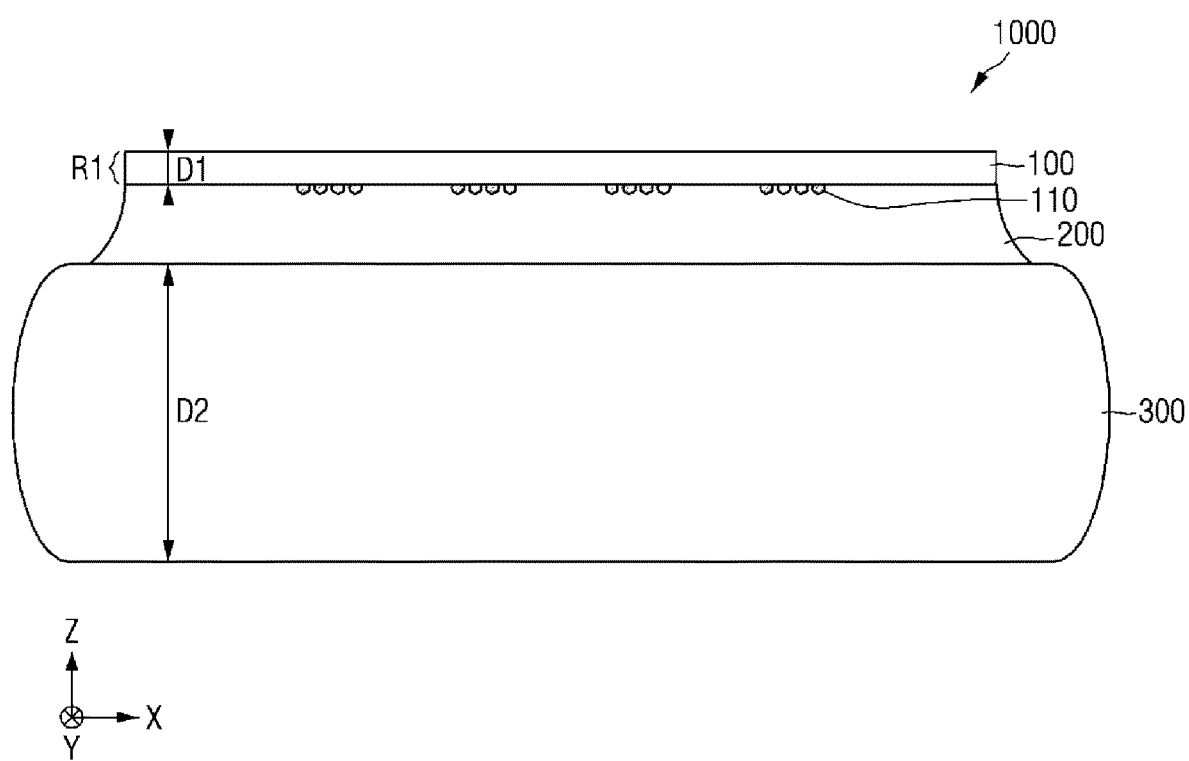

Specifically, referring to FIGS. 18 and 19, the second region R2 of the buffer wafer 100 is removed, and only the first region R1 may remain. Therefore, the thickness of the buffer wafer 100 may be made thinner to the first thickness D1 from the third thickness D3.

When providing the thinned buffer wafer 100 with the first thickness D1 at first, in the formation of the bump 110 or the formation of a structure such as TSV connected to the bump 110, because a crack may be formed in the buffer wafer 100, the process is performed while maintaining the durability in the state of the third thickness D3, and the buffer wafer 100 may be processed to the first thickness D1 later.

Referring back to FIG. 16, a crack detection line 120 is formed (S400).

Figure 20:
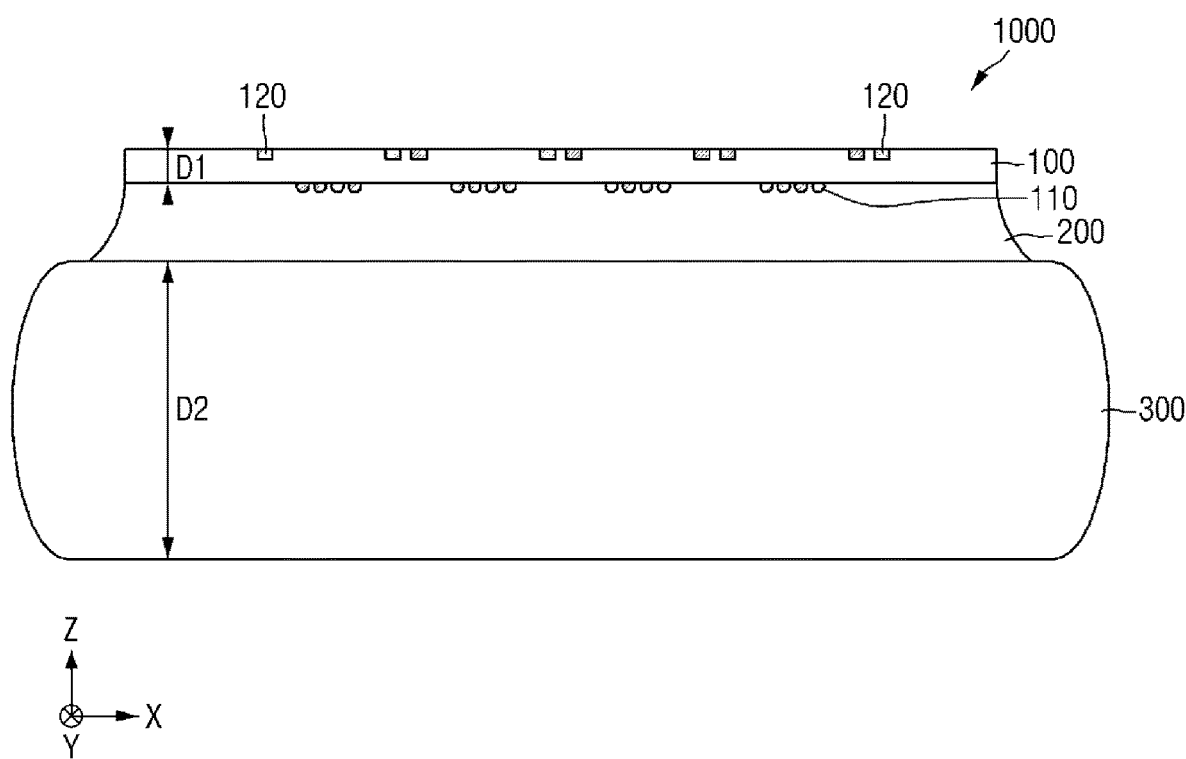

Specifically, referring to FIG. 20, a first crack detection line 120 may be formed on the upper surface of the buffer wafer 100. The first crack detection line 120 may be a single wiring line. The first crack detection line 120 may include a conductor material. The first crack detection line 120 may be exposed from the upper surface of the buffer wafer 100 and may be covered with an insulating film.

The first crack detection line 120 may be formed to surround the periphery of the plurality of package regions. Because the plurality of package regions have a quadrilateral shape, the first crack detection line 120 may have a shape that surrounds four sides of the plurality of package regions.

Referring back to FIG. 16, a plurality of stacked structures 410 to 440 are formed on the buffer wafer (S500).

Specifically, referring to FIGS. 1 and 2, the first to fourth stacked structures 410 to 440 may be stacked in the first to fourth package regions P1 to P4, respectively. Specifically, the first stacked structure 410 may be stacked in the first package region P1, and the second stacked structure 420 may be stacked in the second package region P2. The third stacked structure 430 may be stacked in the third package region P3, and the fourth stacked structure 440 may be stacked in the fourth package region P4.

Each of the first to fourth stacked structures 410 to 440 may include a plurality of chips stacked in the third direction Z. Each of the plurality of chips may be electrically connected to one another, using a TSV. However, the example embodiment is not limited thereto.

Although FIG. 2 illustrates a case in which the four stacked structures 410 to 440 are provided for each row, this is an example, and the example embodiment is not limited thereto. That is, the number of stacked structures for each row may be varied based on the design intent.

The first crack detection line 120 extends in the second direction Y along the side surface of the first package region P1 between the first package region P1 and the second package region P2, extends to bend in the first direction X again, and then may extend to bend in the second direction Y along the side surface of the first package region P1. Therefore, the first crack detection line 120 may include two parallel portions extending in the second direction Y between the first package region P1 and the second package region P2. The parallel portions may be connected by a portion extending in the first direction X.

The first crack detection line 120 may be formed by a single line in the buffer wafer 100. Therefore, the single first crack detection line 120 may be used to easily determine the presence or absence of a crack in the entire buffer wafer 100.

The first crack detection line 120 may intersect a scribe line SL. The scribe line SL may be an outline by which the buffer wafer 100 is separated in the dicing process. Therefore the first crack detection line 120 may exist in a dummy line which is not actually used after dicing.

Referring back to FIG. 16, a mold layer 500 is formed (S600).

Figure 21:
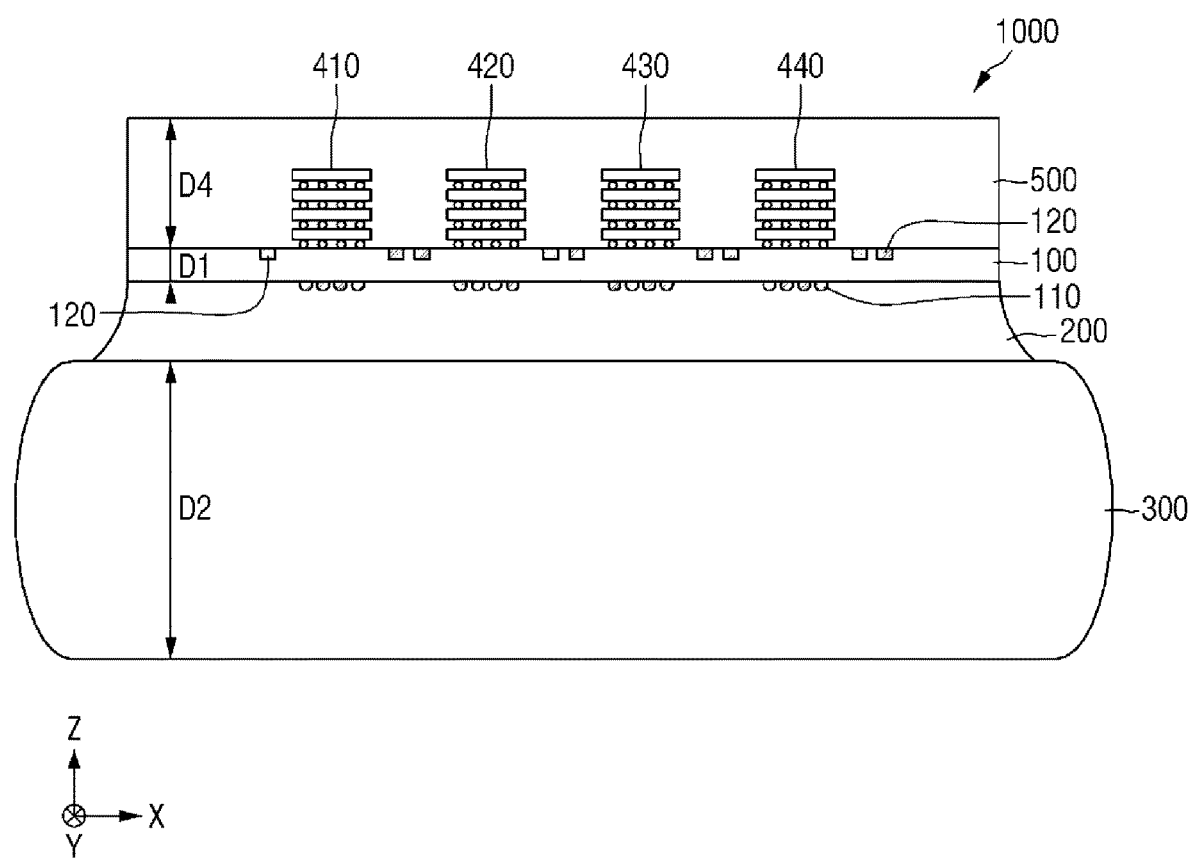

Specifically, referring to FIG. 21, the mold layer 500 may cover the upper surface of the buffer wafer 100 and the stacked structures 410 to 440. The mold layer 500 may also fill the side surfaces of the stacked structures 410 to 440 and the gaps in the stacked structure 410 to 440.

The mold layer 500 may be formed of, for example, a silicon-based material, a thermosetting material, a thermoplastic material, a UV treatment material, or the like. Alternatively, the mold layer 500 may be formed of a polymer such as a resin, and may be formed of, for example, EMC.

At this time, the thickness of the mold layer 500 may be a fourth thickness D4. The fourth thickness D4 may be a thickness that may sufficiently cover the first to fourth stacked structures 410 to 440.

Referring back to FIG. 16, after forming the crack detection line (S400), until the mold layer is formed (S600), the presence or absence of the crack is inspected (S450). That is, even while forming the stacked structure (S500), the presence or absence of a crack may be inspected many times.

Specifically, referring to FIGS. 1, 2 and 20, cracks may occur in the buffer wafer 100 by a plurality of processes, even before the stacked structures 410 to 440 are stacked. In the manufacturing process of the related art, because such cracks are inspected and discovered right before dicing after de-bonding, a meaningless process such as stacking the stacked structure on the buffer wafer 100 already having a crack may be performed. The process costs and time may be wasted accordingly.

Because a method of manufacturing a semiconductor package according to an example embodiment may easily inspect the presence or absence of a crack in the buffer wafer 100 even before stacking the stacked structures, the waste of the cost and time of the process can be minimized.

In addition, because the stacked structure is formed through a process in which a plurality of chips is stacked, the process in which individual chips are stacked may be performed in several steps. Also in the interval between the several steps, the method of manufacturing the semiconductor package according to the example embodiment can quickly and easily inspect the presence or absence of cracks in the buffer wafer 100.

As a result, it is possible not only to be able to rapidly detect the occurrence of a crack, but also to accurately know in which process step the crack has occurred. Thus, it is possible to easily improve the future processes.

However, if the first pad 121 and the second pad 122 of the first crack detection line 120 are covered with the mold layer 500, the presence or absence of a crack may be no longer detected through the first crack detection line 120.

Referring back to FIG. 16, after forming the mold layer 500 (S600), a part of the mold layer 500 is removed (S700).

Figure 22:
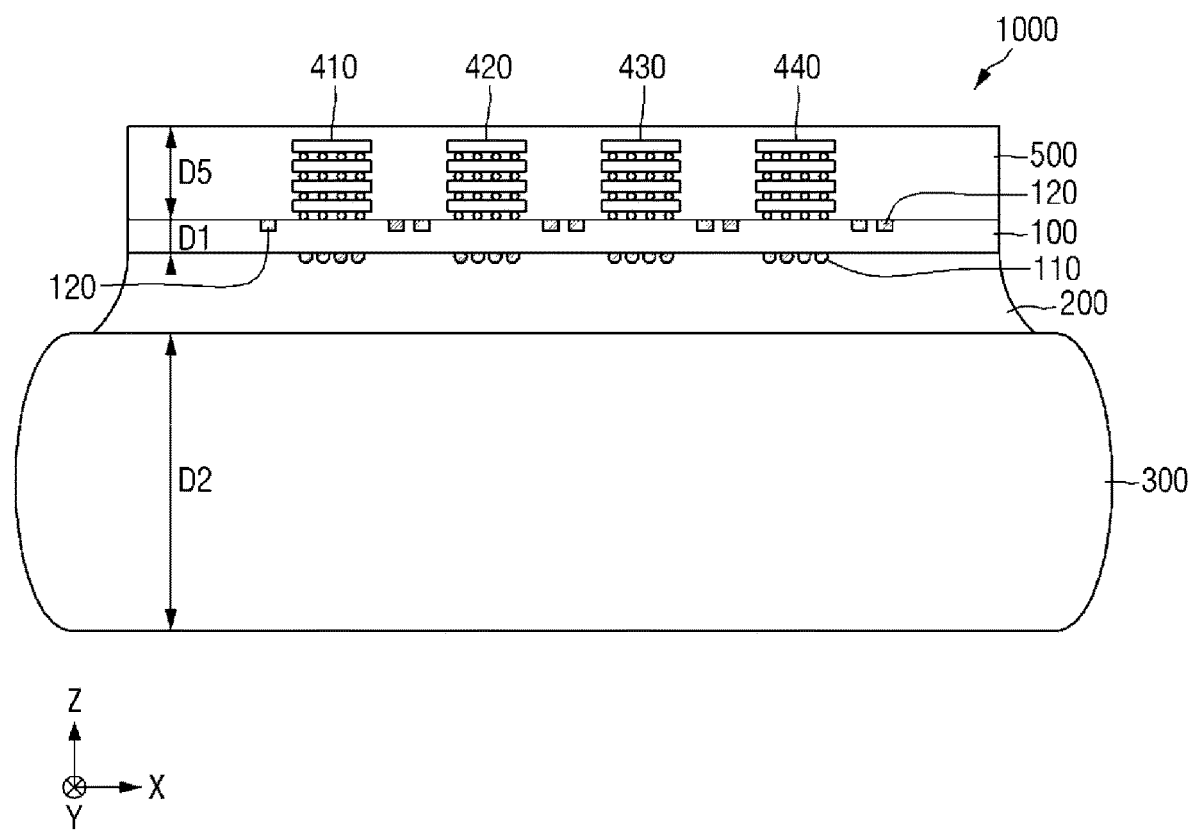

Specifically, referring to FIGS. 21 and 22, the upper portion of the mold layer 500 may be partially ground and removed. Therefore, the thickness of the mold layer 500 may be reduced from the fourth thickness D4 to the fifth thickness D5. Although the upper surfaces of the first to fourth stacked structures 410 to 440 are still covered with the mold layer 500 in FIG. 22, the example embodiment is not limited thereto. If necessary, the upper surfaces of the plurality of stacked structures including the first to fourth stacked structures 410 to 440 may be exposed during this removal process.

Referring back to FIG. 16, the carrier wafer 300 is de-bonded (S800).

Figure 23:
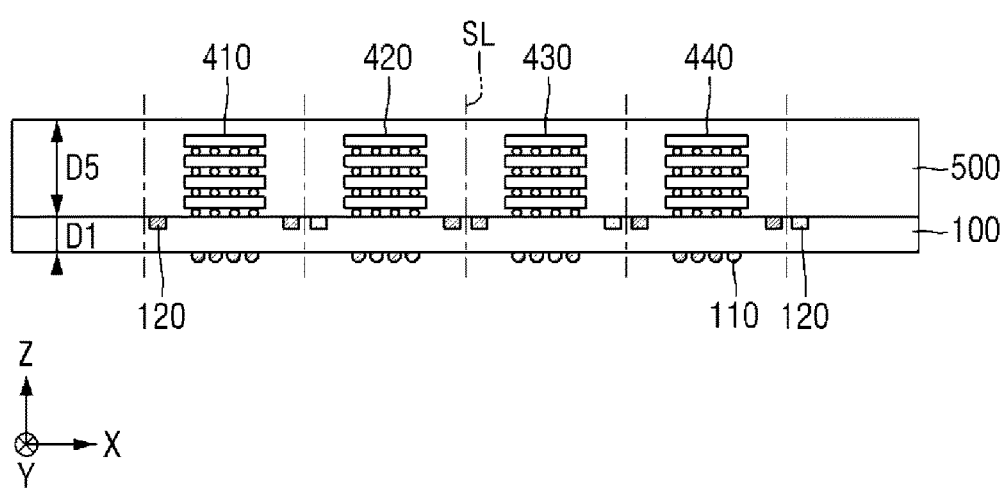

Specifically, referring to FIGS. 22 and 23, as the glue layer 200 is separated from the buffer wafer 100, the carrier wafer 300 and the buffer wafer 100 may be separated from each other. The carrier wafer 300 is a wafer attached for improving durability of the relatively thin buffer wafer 100 and may be a portion that is ultimately not needed.

The glue layer 200 may be separated, cleaned and completely removed from the lower portion of the buffer wafer 100. Therefore, the lower surface of the buffer wafer 100 and the plurality of bumps 110 may be completely exposed to the outside.

Referring back to FIG. 16, the semiconductor package is tested (S900).

Specifically, referring to FIG. 23, a plurality of stacked structures, including first through fourth stacked structures 410 to 440, may be tested at the package level, respectively. It is also possible to detect the presence or absence of cracks through the 2D visual inspection during testing.

However, because the above 2D visual inspection takes a long time and may not detect fine cracks accurately, the 2D visual inspection may be performed to supplement the inspection (S450) for the presence or absence of cracks of FIG. 16 and used as a role of enhancing the reliability and accuracy of the inspection.

Also, because the conventional 2D visual inspection takes a long time, it may not be applied to all wafers and may be applied to only sampled wafers. However, because the semiconductor package according to example embodiments may simply apply only the current to the first crack detection line 120, the crack inspection can be performed very quickly and easily. Also, such an inspection may be repeatedly performed many times.

On the other hand, an EDS test for overall operation as well as a crack inspection may be performed on the semiconductor package.

Referring back to FIG. 16, the buffer wafer 100 is diced (S1000).

Specifically, referring to FIG. 23, the buffer wafer 100 is diced along the scribe lines SL so that semiconductor packages including the respective stacked structures are separated from one another.

The dicing means cutting of the buffer wafer 100 along the scribe lines SL. The dicing means separating of the stacked structures 410 to 440 and the mold layer 500 stacked on the buffer wafer 100 together into individual package elements, rather than simply cutting of the buffer wafer 100.

In the method of manufacturing the semiconductor package according to the example embodiment, because the presence or absence of a crack can be easily inspected before the package is completed, it is possible to easily know in which process the crack has occurred, and the process may be improved.

Hereinafter, a method of manufacturing a semiconductor package according to an example embodiment will be described with reference to FIGS. 10 and 24. Previously described parts of the above-described example embodiment will be simplified or omitted.

Figure 24:
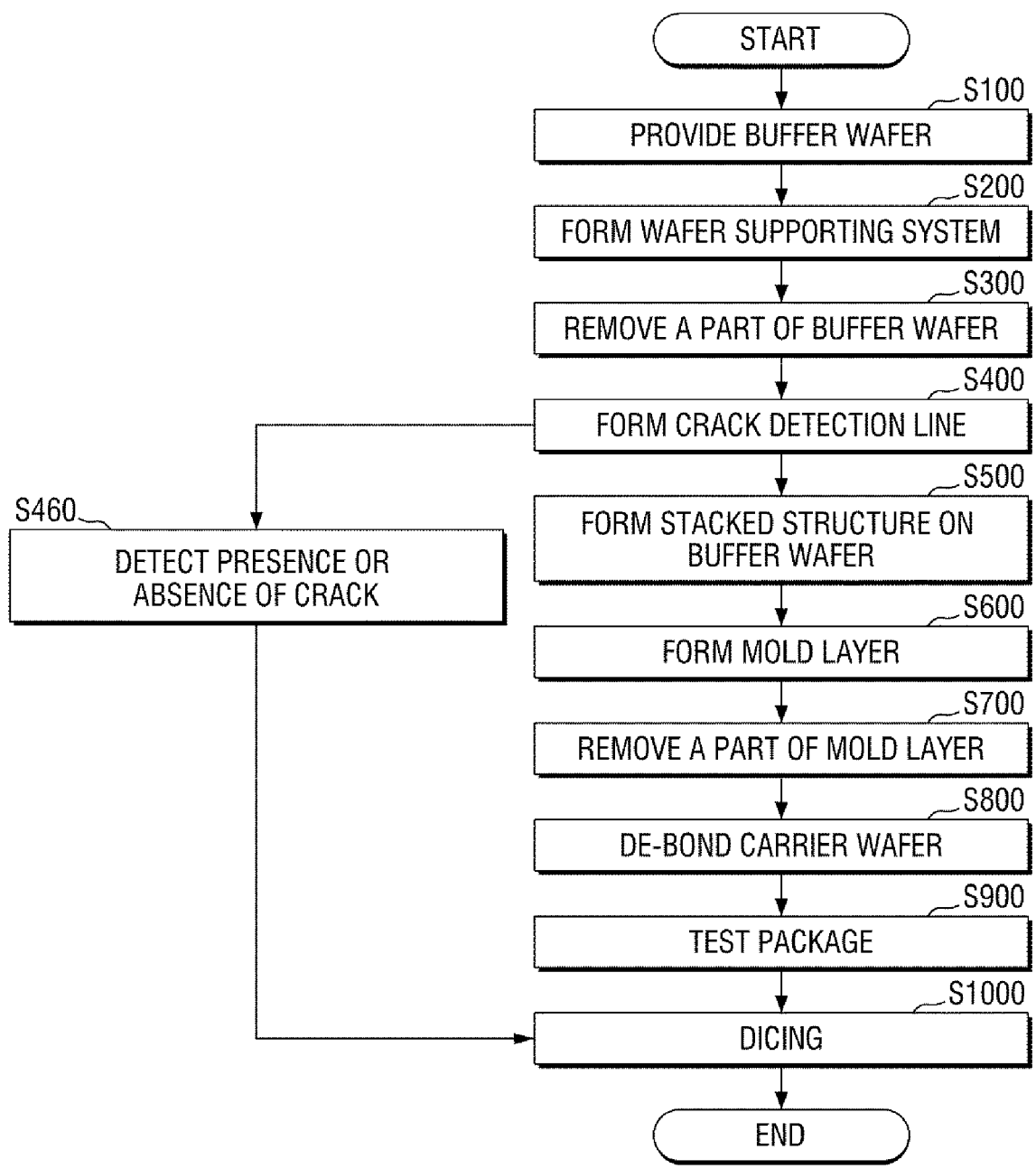
FIG. 24 is a flowchart illustrating the method of manufacturing the semiconductor package according to some embodiments.

FIG. 24 is a flowchart illustrating a method of manufacturing a semiconductor package according to an example embodiment.

First, referring to FIG. 24, in the method of manufacturing the semiconductor package according to the example embodiment, the process of providing a buffer wafer (S100) and the process of dicing the buffer wafer (S1000) are the same as those of the example embodiment of FIG. 16.

However, unlike the example embodiment of FIG. 16, after the mold layer is formed (S600), inspection (S460) of the presence or absence of the crack via the crack detection line may be continuously executed until dicing (S1000).

Specifically, referring to FIG. 10, because the first pad 121 and the second pad 122 are disposed in an edge region Re in which the mold layer 500 is not formed, it is possible to detect the presence or absence of the crack through the first crack detection line 120, regardless of the presence or absence of the mold layer 500.

Therefore, the presence or absence of a crack can be continuously inspected by the first crack detection line 120 before the first crack detection line 120 is cut by dicing.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a buffer wafer comprising:
   a first surface; and
   a second surface opposite to the first surface;
   a stacked structure comprising a plurality of chips being stacked on the first surface of the buffer wafer;
   a first detection line formed around a periphery of the stacked structure on the first surface of the buffer wafer; and
   a mold layer covering the stacked structure, the first detection line and the first surface of the buffer wafer.

2. The semiconductor package of claim 1, wherein the first detection line comprises a conductor, and
   wherein the first detection line is electrically insulated from the stacked structure.

3. The semiconductor package of claim 1, further comprising a second detection line formed on the second surface of the buffer wafer.

4. The semiconductor package of claim 3, further comprising:
   a first pad; and
   a second pad, the first pad and the second pad disposed at opposite ends of the first detection line.

5. The semiconductor package of claim 1, wherein a shape of the first detection line has a bilateral symmetry.

6. The semiconductor package of claim 1, further comprising a bump protruding from the second surface of the buffer wafer, the bump being electrically connected to the stacked structure.

7. A semiconductor package comprising:
a buffer wafer comprising a plurality of package regions being defined by scribe lines, the plurality of package regions comprising:
a first package region; and
a second package region;
a first stacked structure formed on the first package region;
a second stacked structure formed on the second package region;
a first detection line formed as a single line extending along a periphery of the first stacked structure and the second stacked structure, the first detection line intersecting the scribe lines; and
a first pad and a second pad, the first pad and the second pad being disposed at opposite ends of the first detection line, the first pad and the second pad being exposed to an exterior of the buffer wafer.

8. The semiconductor package of claim 7, wherein each of the first stacked structure and the second stacked structure comprises a plurality of chips which are stacked on one another.

9. The semiconductor package of claim 8, wherein the first stacked structure and the second stacked structure are electrically insulated from the first detection line.

10. The semiconductor package of claim 7, wherein the scribe lines are formed in a first direction or a second direction perpendicular to the first direction, the scribe lines defining boundaries of the plurality of package regions in a lattice form.

11. The semiconductor package of claim 10, wherein the first stacked structure and the second stacked structure are adjacent to each other in the first direction, and
wherein the first detection line comprises:
a first portion;
a second portion, the first portion and the second portion extending in the second direction and are spaced part from each other in the first direction between the first stacked structure and the second stacked structure; and
a third portion connecting the first portion and the second portion.

12. The semiconductor package of claim 11, wherein the third portion extends in the first direction, and
wherein the third portion comprises a protrusion protruding in the second direction.

13. The semiconductor package of claim 12, wherein:
the plurality of package regions further comprise:
a third package region; and
a fourth package region,
the third package region is adjacent to the first package region in the second direction,
the fourth package region is adjacent to the second package region in the second direction, and
the third package region is adjacent to the fourth package region in the first direction.

14. The semiconductor package of claim 13, wherein the first detection line further comprises:
a fourth portion; and
a fifth portion, the fourth portion and the fifth portion extending in the second direction and are spaced apart from each other in the first direction between a third stacked structure and a fourth stacked structure; and
a sixth portion connecting the fourth portion and the fifth portion.

15. The semiconductor package of claim 14, wherein the protrusion overlaps the fourth portion and the fifth portion in the first direction.

16. The semiconductor package of claim 7, further comprising:
an edge detection line formed along an edge portion of the buffer wafer; and
a third pad and a fourth pad formed at opposite ends of the edge detection line.

17. The semiconductor package of claim 16, wherein:
the edge detection line comprises:
a first edge detection line; and
a second edge detection line, the first edge detection line and the second edge detection line being insulated from each other,
the first edge detection line and the second edge detection line are connected to the third pad and the fourth pad,
the semiconductor package further comprises:
a fifth pad formed at a third end opposite to the third pad in the first edge detection line; and
a sixth pad formed at a fourth end opposite to the fourth pad in the second edge detection line.

18. A buffer wafer for a semiconductor package comprising:
a first surface comprising a plurality of package regions defined by a plurality of scribe lines, a plurality of stacked structures being stacked in the plurality of package regions, respectively;
a second surface formed opposite to the first surface and on which a plurality of bumps respectively connected to the plurality of stacked structures are formed; and
a first detection line formed on the first surface and surrounding four sides of each of the plurality of stacked structures, the first detection line comprising a single line.

19. The buffer wafer of claim 18, further comprising a second detection line disposed on the second surface.

20. The buffer wafer of claim 19, wherein the second detection line is included in each of the plurality of stacked structures.

* * * * *